US012694910B2

(12) United States Patent
Wang et al.

(10) Patent No.: US 12,694,910 B2
(45) Date of Patent: Jul. 28, 2026

(54) MEMORY DEVICE AND OPERATION METHOD FOR DATA MOVEMENT WITHIN MEMORY SECTIONS AND THROUGH EXTERNAL INTERFACES OF MEMORY DEVICE

(71) Applicant: PieceMakers Technology, Inc., Hsinchu City (TW)

(72) Inventors: Gyh-Bin Wang, Hsinchu City (TW); Ming-Xun Yang, Hsinchu City (TW)

(73) Assignee: PieceMakers Technology, Inc., Hsinchu City (TW)

( * ) Notice: Subject to any disclaimer, the term of this patent is extended or adjusted under 35 U.S.C. 154(b) by 60 days.

(21) Appl. No.: 18/811,786

(22) Filed: Aug. 22, 2024

(65) Prior Publication Data

US 2025/0166669 A1 May 22, 2025

Related U.S. Application Data

(60) Provisional application No. 63/600,743, filed on Nov. 20, 2023.

(51) Int. Cl.
*G11C 11/406* (2006.01)
*G11C 5/06* (2006.01)
*G11C 11/4091* (2006.01)

(52) U.S. Cl.
CPC .......... *G11C 5/066* (2013.01); *G11C 11/4091* (2013.01)

(58) Field of Classification Search
CPC ............................ G11C 5/066; G11C 11/4091
See application file for complete search history.

(56) References Cited

U.S. PATENT DOCUMENTS

| | | | | |
|---|---|---|---|---|
| 5,732,018 A | * | 3/1998 | Choi | G11C 7/1051 |
| | | | | 365/185.21 |
| 12,057,159 B2 | * | 8/2024 | Kolar | G11C 7/1018 |
| 2007/0058407 A1 | | 3/2007 | Dosaka | |
| 2010/0165705 A1 | | 7/2010 | Sumita | |
| 2014/0254232 A1 | | 9/2014 | Wu | |
| 2016/0100193 A1 | * | 4/2016 | Mishra | G06F 17/16 |
| | | | | 375/240.2 |
| 2019/0259447 A1 | | 8/2019 | Shaeffer | |

FOREIGN PATENT DOCUMENTS

| | | |
|---|---|---|
| TW | I661310 B | 6/2019 |
| TW | 202145016 A | 12/2021 |
| TW | I755211 B | 2/2022 |
| TW | I773106 B | 8/2022 |

* cited by examiner

*Primary Examiner* — Min Huang
(74) *Attorney, Agent, or Firm* — Winston Hsu

(57) ABSTRACT

A memory device is provided, which includes a memory array and data transfer circuits. The memory array is divided into multiple memory sections, each containing memory cells. A data transfer circuit is placed between two memory sections. Through this data transfer circuit, data can move either from all or from a selected set of bit lines or bit-line pairs within a section to adjacent memory sections, or between data interfaces other than the bit lines or bit-line pairs in the memory sections. Data signals from all or a selected set of bit lines or bit-line pairs in the memory sections are sensed, latched, buffered, and repeated for data transfer or for executing logic operations via the data transfer circuit. These data movements and logic operations within the memory device can be executed in parallel. A method for controlling and operating such a memory device is also provided.

28 Claims, 23 Drawing Sheets

Bit-line (bit-line pair) of memory section A

Bit-line (bit-line pair) of memory section B

Bit-lines (bit-line pairs) of memory section A

Bit-lines (bit-line pairs) of memory section B

Bit-lines (bit-line pairs) of memory section A

Bit-lines (bit-line pairs) of memory section B

Bit-line (bit-line pair) of memory section A

Bit-line (bit-line pair) of memory section B

Bit-lines (bit-line pairs) of memory section A

Bit-lines (bit-line pairs) of memory section B

Bit-lines (bit-line pairs) of memory section A

S :BLSA

Bit-lines (bit-line pairs) of memory section B

Bit-line (bit-line pair) of memory section A

Bit-line (bit-line pair) of memory section B

Bit-lines (bit-line pairs) of memory section A

Bit-lines (bit-line pairs) of memory section B

Bit-lines (bit-line pairs) of memory section A

Bit-lines (bit-line pairs) of memory section B

Bit-line (bit-line pair) of memory section A

Bit-line (bit-line pair) of memory section A

Bit-line (bit-line pair) of memory section A

Bit-lines (bit-line pairs) of memory section A

Bit-lines (bit-line pairs) of memory section A

Bit-line (bit-line pair) of memory section A

Bit-lines (bit-line pairs) of memory section A

MEMORY DEVICE AND OPERATION METHOD FOR DATA MOVEMENT WITHIN MEMORY SECTIONS AND THROUGH EXTERNAL INTERFACES OF MEMORY DEVICE

CROSS REFERENCE TO RELATED APPLICATIONS

This application claims the benefit of U.S. Provisional Application No. 63/600,743, filed on Nov. 20, 2023. The content of the application is incorporated herein by reference.

BACKGROUND OF THE INVENTION

1. Field of the Invention

This invention relates to memory management, and more particularly, a memory device and operation method for data movement within its sections and through external interfaces.

2. Description of the Prior Art

Conventional data access schemes in memory devices often suffer from high cell-array-peripheral circuit area, power consumption, and limited bandwidth. This necessitates a novel architecture and data access method to address these limitations.

SUMMARY OF THE INVENTION

It is therefore an objective of the present invention to provide a memory device and an operation method for data movement within memory sections and through external interfaces of the memory device, to solve the abovementioned problem.

An embodiment of the present invention discloses a memory device, comprising: a memory array, divided into a plurality of memory sections, each memory section comprising a plurality of memory cells; a plurality of data transfer circuits, each data transfer circuit being disposed between two memory sections; wherein a data movement occurring from all or a selected set of bit-lines or bit-line pairs between any two adjacent memory sections of the memory array is performed, data signals of all or the selected set of bit-lines or bit-line pairs of two adjacent memory sections are sensed, latched, buffered and repeated during the data movement by a data transfer circuit disposed between two adjacent memory sections, and the data movement is sequentially performed between two memory sections to facilitate the transfer of data signals to any memory section of the memory array without the need for global or trans-multiple-section data lines.

An embodiment of the present invention further discloses an operation method for data movement through memory sections and with external interfaces of a memory device, the memory device comprising a memory array divided into a plurality of memory sections, each memory section comprising a plurality of memory cells, the operation method comprising: performing a data movement occurring from all or a selected set of bit-lines or bit-line pairs between any two adjacent memory sections of the memory array; sensing, latching, buffering, and repeating data signals of all or the selected set of bit-lines or bit-line pairs of one of two adjacent memory sections during the data movement to the adjacent memory section by a data transfer circuit disposed between two adjacent memory sections; and sequentially performing the data movement between two memory sections to facilitate the transfer of data signals to any memory section of the memory array without the need for global or trans-multiple-section data lines.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
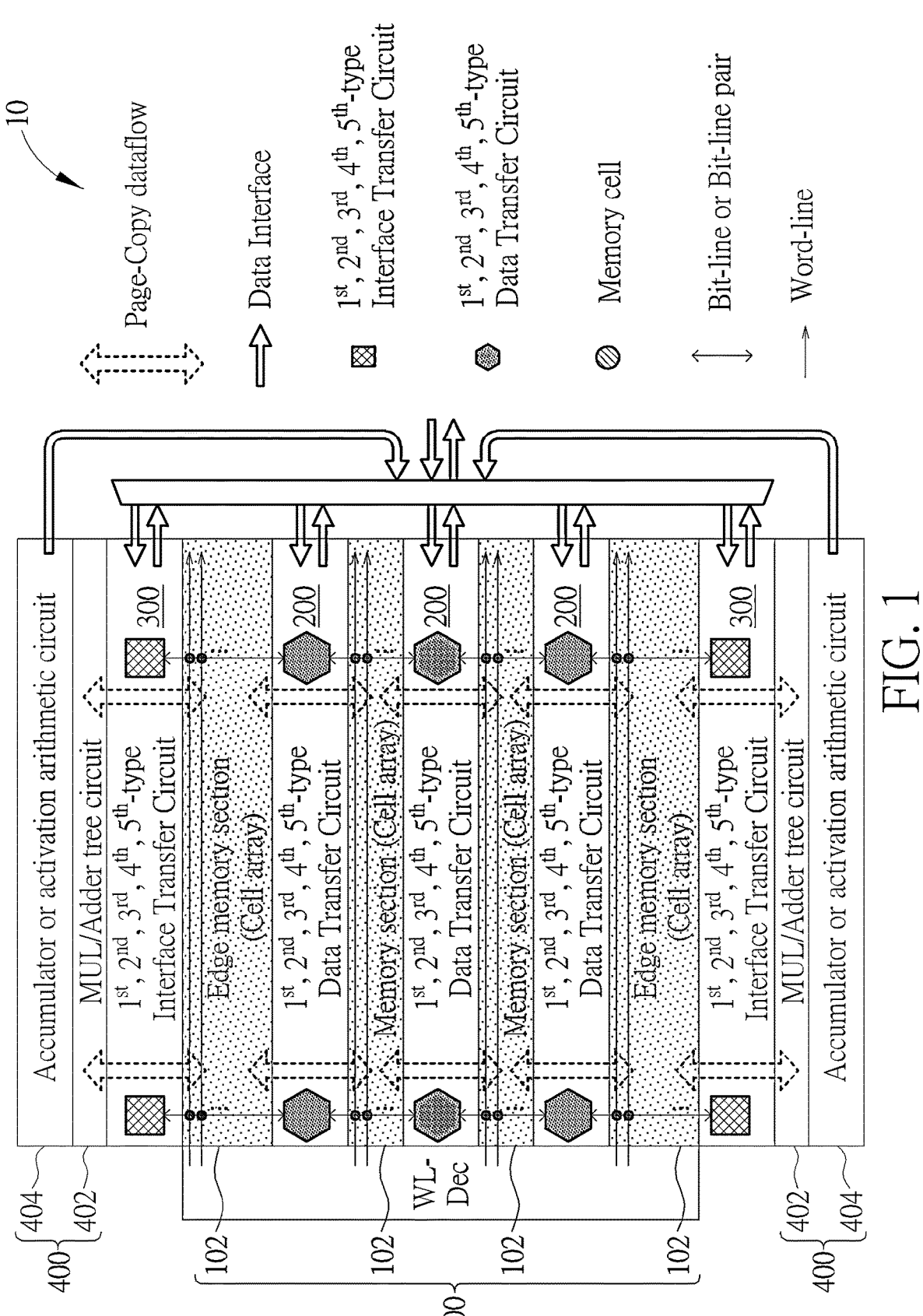
FIG. 1 is a schematic diagram of a memory device according to an embodiment of the present invention.

FIG. 1 is a schematic diagram of a memory device 10 according to an embodiment of the present invention. The memory device 1 may be applied to a variety of memory cores, including static random access memory (SRAM), dynamic random access memory array (DRAM), resistive random access memory (RRAM), magneto-resistive random access memory (MRAM), ferroelectric random-access memory (FeRAM), flash memory, or any other kind of memory core. As shown in FIG. 1, the memory device 10 includes a memory array 100, data transfer circuits 200, interface transfer circuits 300 and computing logic circuits 400. The memory array 100 may be utilized for storing data. The memory array 100 may be divided into a plurality of memory sections 102. Each memory section 102 includes a plurality of memory cells which are partitioned into multiple pages and each page of memory cells are coupled by a corresponding word line. For example, the memory sections 102 may be utilized for storing parameters of AL models and intermediate data generated during deep-layer arithmetic. A plurality of bit lines and a plurality of word lines are respectively coupled to memory cells of the memory array 100. The plurality of bit lines and word lines may be arranged to perform access control of the memory array 100.

Figure 2:
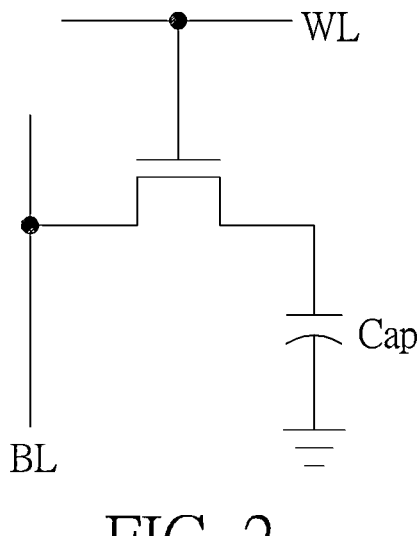
FIG. 2 illustrates a 1T1C memory cell of the memory array shown in FIG. 1 according to an embodiment of the present invention.
Figure 3:
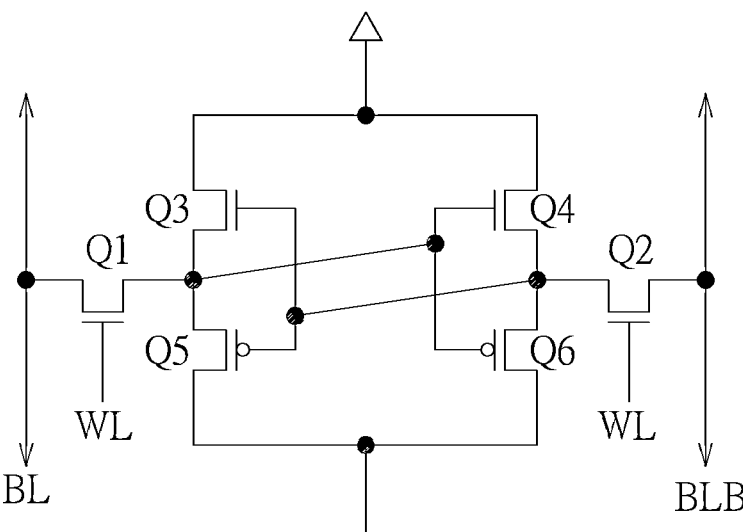
FIG. 3 illustrates a 6T memory cell of the memory array shown in FIG. 1 according to an embodiment of the present invention.

The memory array 100 may be designed by employing a differential bit-line mechanism or a single bit-line mechanism. For example, regarding the memory array with single bit-line mechanism, please refer to FIG. 2. FIG. 2 illustrates a 1T1C (one transistor, one capacitor) memory cell (for example, in a form of DRAM cell) of the memory array 100 shown in FIG. 1 according to an embodiment of the present invention. This memory cell may be taken as an example of any memory cell (e.g. each memory cell) of the plurality of memory cells of the memory array 100. As shown in FIG. 2, the memory cell may include a switch (e.g. a transistor such as a Metal Oxide Semiconductor Field Effect Transistor (MOSFET)) coupled to a certain word line (WL) of the plurality of word lines and a certain bit line (BL)) of the plurality of bit lines, and include a capacitor Cap. The capacitor Cap may be arranged to store electric charge, and different states of the electric charge may indicate a bit of information (e.g. 0 or 1), but the present invention is not limited thereto. Some embodiments may also utilize a 2T2C (two transistor, two capacitor) memory cell to increase reliability. Those in the art know normal structure and functioning of a 2T2C memory cell. For example, regarding the memory array with differential bit-line mechanism, please refer to FIG. 3. FIG. 3 illustrates a 6T (six transistors) memory cell (for example, in a form of DRAM cell) of the memory array 100 shown in FIG. 1 according to an embodiment of the present invention. This memory cell may be taken as an example of any memory cell (e.g. each memory cell) of the plurality of memory cells of the memory array 100. As shown in FIG. 3, the memory cell may comprise transistors Q1 to Q6. The transistors Q1 and Q2 are coupled to a certain word line (WL) of the plurality of word lines and a certain pair of bit line (e.g., BL and BLB in the figure) of the plurality of bit lines for accessing or storing data in the memory cell.

Please further refer to FIG. 1, the memory device 10 includes a plurality of data transfer circuits 200, and each data transfer circuit 200 is disposed between two memory sections 102 and each data transfer circuit 200 is coupled to two bit-lines or bit-line pairs located in the two different memory sections 102. The data transfer circuit 200 may serve as a data path of inter-section data movement. The data transfer circuit 200 may be coupled between two memory sections 102, and a data movement occurring from all or a selected set of bit-lines or bit-line pairs between any two adjacent memory sections 102 may be performed. Data signals of all or the selected set of bit-lines or bit-line pairs of two adjacent memory sections 102 are sensed, latched, buffered, and repeated during the data movement by the data transfer circuit 200 disposed between two adjacent memory sections 102. Such like this, the data movement may be sequentially performed between two neighboring memory sections 102 of the memory array 100 to facilitate the transfer of data signals to any memory section of the memory array without the need for global or trans-multiple-section data lines. Therefore, data signals may be sequentially propagated across subsequent memory sections 102 through the data transfer circuits 200 between the subsequent memory sections 102. As such, data signals may be propagated sequentially from memory section to subsequent adjacent memory section until a target location is reached for inter-section data movement. In addition, during the section-by-section data transfer procedure, a word line of the target section or signal-pass-by sections may be activated to capture the data on their bit-lines or bit-line pairs and store it in the memory cells coupled to the activated word line. The data transfer circuit 200 may also serve as a circuit for data transition to and from the memory section 102 from and to a signal interface, other than the bit-line or bit-line pair. A data sequence may be written to a data transfer circuit 200 section-by-section in serial (normal way) or parallelized to multiple data transfer circuits 200 in parallel (transposed way). A series of data originally stored in the memory cells coupled to a word line may be retrieved, and then the data, with or without further manipulation, may be stored in the memory cells coupled to a plurality of word lines in a plurality of memory sections sequentially, thereby rotating the series data in the memory device in a transposed manner. A page of data may be copied and moved from the memory sections in advance to the memory sections that are adjacent to or near the logic computing circuits for fast or repeated access and manipulation the page data.

The memory device 10 includes a plurality of interface transfer circuits 300. As shown in FIG. 1, the memory section 102 coupled to the interface transfer circuit 300 may be regarded as an edge memory section. Each interface transfer circuit 300 is coupled to an edge memory section 102. The interface transfer circuit 300 may be utilized for directly transferring or multiplexing data from the edge memory section 102, which can be used as a cache memory section where data can be moved and stored in advance for fast access later, to a circuit connected to a signal interface other than the bit-line or bit-line pair. It can also write data from the circuit connected to a signal interface other than the bit-line or bit-line pair to the edge memory section 102 for off-bit-line data transition. The circuit connected to a signal interface other than the bit-line or bit-line pair may be any internal circuit of the memory device 10. For example, the circuit connected to a signal interface other than the bit-line or bit-line pair may be a core logic circuit or a computing logic circuit for further arithmetic operation, but not limited thereto. The circuit connected to a signal interface other than the bit-line or bit-line pair may be an external device. For example, the circuit connected to a signal interface other than the bit-line or bit-line pair may be a storage device with large capacity, but not limited thereto.

Please further refer to FIG. 1. Any two of the memory sections may be the same or similar to each other, and any two of the data transfer circuits 200 may be the same or similar to each other. Each data transfer circuit 200 is disposed between two memory sections 102. For each data transfer circuit 200, the data transfer circuit 200 may be coupled to two bit-lines or bit-line pairs located in the two different memory sections 102 on opposite sides of the data transfer circuit 200 (e.g. two memory sections adjacent to a certain data transfer circuit). The data transfer circuit 200 may be considered as the data path of inter-section data movement between two adjacent memory sections 102. Data signals on the bit-lines or bit-line pairs in one memory section 102 may be transferred to the bit-lines or bit-line pairs in an adjacent memory section adjacent to the memory section. For example, data signals may be inputted or outputted by the uppermost (foremost) data transfer circuit 200 coupled to the computing logic circuits 400 and propagated to the first-stage data transfer circuit 200. Data signals may also be inputted or output by the data interface, other than the bit-lines or bit-line pairs, of the data transfer circuit 200 between any two memory sections, from or to other logic circuits outside of the data transfer circuit 200 and memory sections. Through signal sensing and buffering performed by the data transfer circuit 200, data signals on the bit-lines or bit-line pairs in the memory section may be transferred to the bit-lines or bit-line pairs in an adjacent memory section. As such, the data signals may be sequentially propagated across a plurality of subsequent memory sections through a plurality of data transfer circuit 200 between subsequent memory sections. The interface transfer circuit 300 coupled to the bottommost memory section 102 may access the data signals and propagate the data signals to the computing logic circuits 400 or an external device for further operations.

The data transfer circuit 200 coupled between two different memory sections via different bit-lines or bit-line pairs may be utilized to perform data movement operation to transfer dada signal from a memory section to a neighboring memory section for inter-section data movement. All or part of the variant types of data transfer circuits 200 may be coupled to the bit-line or bit-line pairs in the memory section can be operated in serial or parallel. The application may be directed toward movement of data a page at a time, where a page may be defined as data stored in all memory cells activated by a same single word line. The data transfer circuit 200 may include a plurality of first-type data transfer circuits 202 for inter-section data movement.

Figure 4:
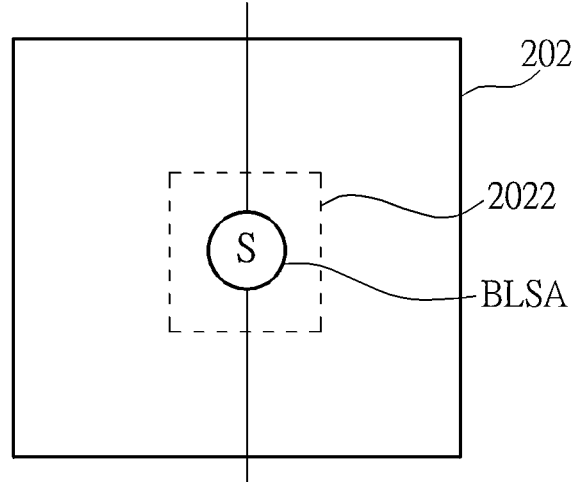
FIG. 4 is a schematic diagram of a first-type data transfer circuit according to an embodiment of the present invention.

Please refer FIG. 4. FIG. 4 is a schematic diagram of a first-type data transfer circuit 202 according to an embodiment of the present invention. The first-type data transfer circuit 202 may be utilized to perform data movement operation to transfer data signals from one memory section (e.g., memory section A) to neighboring memory section (e.g., memory section B) for inter-section data movement. As shown in FIG. 4, the first-type data transfer circuit 202 includes a first-type sensing buffer circuit 2022. The first-type sensing buffer circuit 2022 includes a bit-line sense amplifier (BLSA). The BLSA of the first-type sensing buffer circuit 2022 is coupled to a bit-line or bit-line pair of a memory section A and a bit-line or a bit-line pair of a memory section B adjacent to the memory section A. For example, when applied to the memory array with single bit-line mechanism, the first-type sensing buffer circuit 2022 may be coupled to a bit-line in the memory section A and a bit-line in the adjacent memory section B. When applied to the memory array with differential bit-line mechanism, the first-type sensing buffer circuit 2022 may be coupled to a bit-line pair in the memory section A and a bit-line pair in the adjacent memory section B. The BLSA of the first-type sensing buffer circuit 2022 is configured to sense data signals driven on the bit-line or bit-line pair in the memory section A, and configured to latch and buffer the sensed/amplified data signals. Further, the latched data signals may be driven and transferred to the bit-line or bit-line pair in the memory section B by the BLSA of the first-type sensing buffer circuit 2022. As such, the data signals on the bit-line or bit-line pair of the memory section A may be propagated to the bit-line or bit-line pair of the memory section B via the first-type data transfer circuit 202. The first-type data transfer circuit 202 of the data transfer circuit 200 may be considered as a data path of inter-section data movement between the memory section A and the memory section B. In addition, a word line of the memory section B may be activated to capture the data on its bit-lines or bit-line pairs and store it in the memory cells coupled to the activated word line.

Through signal sensing and buffering performed by the first-type data transfer circuit 202 of the data transfer circuit 200, data signals on the bit-lines or bit-line pairs in a memory section may be transferred to the bit-lines or bit-line pairs in an adjacent memory section. In the same way, data signals propagated to the bit lines in the memory section B may be propagated further to a memory section C adjacent to the memory section B by using another data transfer circuit between the memory section B and the memory section C. Therefore, the data signals may be sequentially transferred across subsequent memory sections through other data transfer circuits which are coupled to two adjacent memory sections. The data signals may be propagated sequentially from one memory section to subsequent adjacent sections until a target location is reached.

Figure 5:
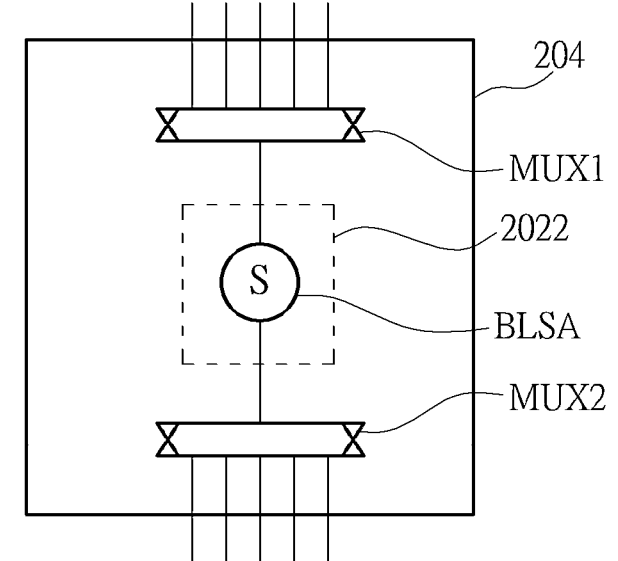
FIG. 5 is a schematic diagram of a second-type data transfer circuit according to an embodiment of the present invention.

In an alternative embodiment, the data transfer circuit 200 may include a plurality of second-type data transfer circuits 204 for inter-section data movement. Please refer FIG. 5. FIG. 5 is a schematic diagram of a second-type data transfer circuit 204 according to an embodiment of the present invention. As shown in FIG. 5, the second-type data transfer circuit 204 may be utilized to perform data movement operation to transfer data signals from a memory section (e.g., memory section A) to a neighboring memory section (e.g., memory section B) for inter-section data movement. The second-type data transfer circuit 204 includes a first-type sensing buffer circuit 2022, a first multiplexer MUX1 and a second multiplexer MUX2. The first-type sensing buffer circuit 2022 includes a BLSA. The BLSA of the first-type sensing buffer circuit 2022 is coupled to the first multiplexer MUX1 and the second multiplexer MUX2. The first multiplexer MUX1 is coupled to a first number of bit-lines or bit-line pairs of a memory section A and the BLSA of the first-type sensing buffer circuit 2022.

The first multiplexer MUX1 is configured to select a set of bit-lines or bit-line pairs of the memory section A from the first number of bit-lines or bit-line pairs of the memory section A, and connect the selected set of bit-lines or bit-line pairs of the memory section A to the BLSA of the first-type sensing buffer circuit 2022. The second multiplexer MUX2 is coupled to a second number of bit-lines or bit-line pairs of a memory section B adjacent to the memory section A and the BLSA of the first-type sensing buffer circuit 2022. The second multiplexer MUX2 is configured to select a set of bit-lines or bit-line pairs of the memory section B from the second number of bit-lines or bit-line pairs of the memory section B, and connect the selected set of bit-lines or bit-line pairs of the memory section B to the BLSA of the first-type sensing buffer circuit. As such, the selected set of bit-lines or bit-line pairs of the memory section A may be connected to the selected set of bit-lines or bit-line pairs of the memory section B through the first-type sensing buffer circuit 2022.

During the inter-section data movement, the BLSA of the first-type sensing buffer circuit 2022 is configured to sense data signals on the selected set of bit-lines or bit-line pairs in the memory section A through connection operations of the first multiplexer MUX1, and configured to latch and buffer the sensed/amplified data signals. Moreover, the BLSA of the first-type sensing buffer circuit 2022 is configured to drive and transfer the latched data signals to the selected set of bit-lines or bit-line pairs in the memory section B through connection operations of the second multiplexer MUX2. Therefore, the data signals on the selected set of bit-lines or bit-line pairs of the memory section A may be propagated to the selected set of bit-lines or bit-line pairs of the memory section B by the second-type data transfer circuit 204. The second-type data transfer circuit 204 of the data transfer circuit 200 may be considered as the data path of inter-section data movement between the memory section A and the memory section B. In addition, a word line of the memory section B may be activated to capture the data on its bit-lines or bit-line pairs and store it in the memory cells coupled to the activated word line.

Through signal sensing and buffering performed by the second-type data transfer circuit 204 of the data transfer circuit 200, data signals on the selected set of bit-lines or bit-line pairs in a memory section may be transferred to the bit-lines or bit-line pairs in an adjacent memory section. In the same way, data signals propagated to the selected set of bit-lines or bit-line pairs in the memory section B may be propagated further to a memory section C adjacent to the memory section B by using another data transfer circuit between the memory section B and the memory section C. Therefore, the data signals may be sequentially transferred across subsequent memory sections through other data transfer circuits which are coupled to two adjacent memory sections until a target location is reached.

Figure 6:
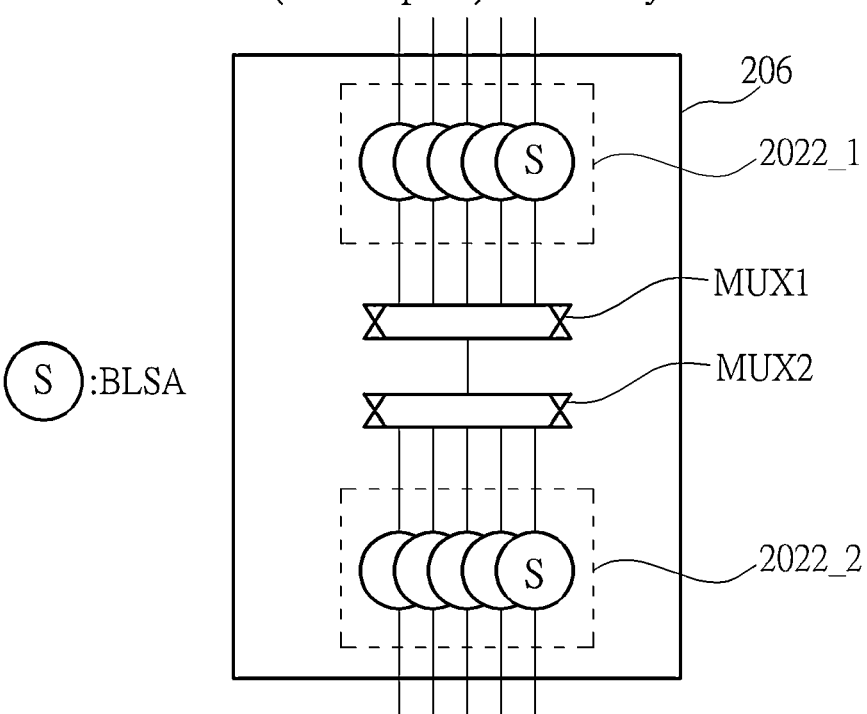
FIG. 6 is a schematic diagram of a third-type data transfer circuit according to an embodiment of the present invention.

In an alternative embodiment, the data transfer circuit 200 may include a plurality of third data transfer circuits 206 for inter-section data movement. Please refer FIG. 6. FIG. 6 is a schematic diagram of a third-type data transfer circuit 206 according to an embodiment of the present invention. As shown in FIG. 6, the third-type data transfer circuit 206 may be utilized to perform data movement operations to transfer data signals from a memory section (e.g., memory section A) to a neighboring memory section (e.g., memory section B) for inter-section data movement. The third-type data transfer circuit 206 includes first-type sensing buffer circuits 2022_1 and 2022_2, a first multiplexer MUX1 and a second multiplexer MUX2. The first-type sensing buffer circuit 2022_1 includes a plurality of BLSAs, and each BLSA of the first-type sensing buffer circuit 2022_1 is coupled to a bit-line or bit-line pair of a memory section A. The first-type sensing buffer circuit 2022_2 includes a plurality of BLSAs, and each BLSA of the first-type sensing buffer circuit 2022_2 is coupled to a bit-line or bit-line pair of a memory section B adjacent to the memory section A. The first multiplexer MUX1 is coupled to the BLSAs of the first-type sensing buffer circuit 2022_1 and the second multiplexer MUX2. The first multiplexer MUX1 is configured to select a set of BLSAs from the BLSAs of the first-type sensing buffer circuit 2022_1, and connect the selected set of BLSAs of the first-type sensing buffer circuit 2022_1 to the second multiplexer MUX2.

The second multiplexer MUX2 is coupled to the BLSAs of the first-type sensing buffer circuit 2022_2 and the first multiplexer MUX1. The second multiplexer MUX2 is configured to select a set of BLSAs from the BLSAs of the first-type sensing buffer circuit 2022_2, and connect the selected set of BLSAs of the first-type sensing buffer circuit 2022_2 to the first multiplexer MUX1. Through the selection and connection operations of the first multiplexer MUX1 and the second multiplexer MUX2, the selected set of BLSAs of the first-type sensing buffer circuit 2022_1, which is coupled to the bit-lines or bit-line pairs of the memory section A, may be connected to the selected set of BLSAs of the first-type sensing buffer circuit 2022_2, which is coupled to the bit-lines or bit-line pairs of the memory section B.

During inter-section data movement, data signals on the bit-lines or bit-line pairs coupled to the selected set of BLSAs of the first-type sensing buffer circuit 2022_1 in the memory section A are sensed, latched, and buffered by the selected set of BLSAs of the first-type sensing buffer circuit 2022_1. The latched data signals are driven and transferred to the selected set of BLSAs of the first-type sensing buffer circuit 2022_2 by the selected set of BLSAs of the first-type sensing buffer circuit 2022_1 through connection operations of the first multiplexer and the second multiplexer. The data signals are transferred to bit-lines or bit-line pairs coupled to the selected set of BLSAs of the first-type sensing buffer circuit 2022_2 in the memory section B by the selected set of BLSAs of the first-type sensing buffer circuit 2022_2. For example, each of the selected set of BLSA of the first-type sensing buffer circuit 2022_1 is configured to sense data signals on the coupled bit-line or bit-line pair in the memory section A, and configured to latch and buffer the sensed/amplified data signals. Moreover, each of the selected set of BLSA of the first-type sensing buffer circuit 2022_1 is configured to drive and transfer the latched data signals to the selected set of BLSAs of the first-type sensing buffer circuit 2022_2, such that the selected set of BLSAs of the first-type sensing buffer circuit 2022_2 transfers the data signals to the coupled bit-line or bit-line pair in the memory section B. Therefore, the data signals on the bit-lines or bit-line pairs of the memory section A may be propagated to the selected set of bit-lines or bit-line pairs of the memory section B by the third-type data transfer circuit 206. The third-type data transfer circuit 206 of the data transfer circuit 200 may be considered as a multiplexed data path of inter-section data movement between the memory section A and the memory section B. In the same way, the data signals may be sequentially transferred across subsequent memory sections through other data transfer circuits which are coupled to two adjacent memory sections until a target location is reached.

Figure 7:
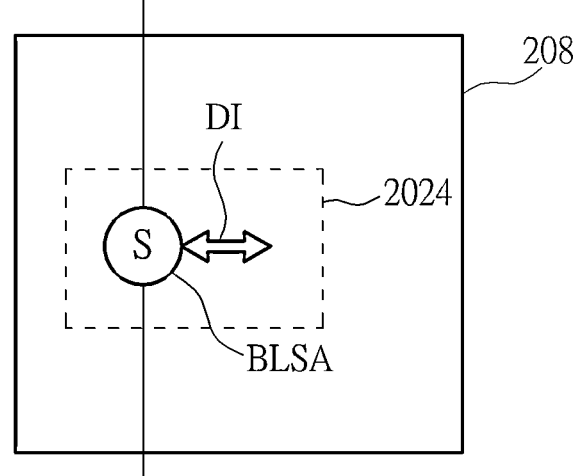
FIG. 7 is a schematic diagram of a fourth-type data transfer circuit according to an embodiment of the present invention.

In an alternative embodiment, the data transfer circuit 200 may include a plurality of fourth-type data transfer circuits 208 for inter-section data movement. Please refer FIG. 7. FIG. 7 is a schematic diagram of a fourth-type data transfer circuit 208 according to an embodiment of the present invention. Please note that the units in the fourth-type data transfer circuit 208 shown in FIG. 7 with the same designations as those in the first-type data transfer circuit 204 shown in FIG. 4 have similar operations and functions. The interconnections of the units can be referred from FIG. 7 and further description thereof is omitted for brevity. As shown in FIG. 7, the fourth-type data transfer circuit 208 may be utilized to perform data movement operation to transfer data signals from a memory section (e.g., memory section A) to a neighboring memory section (e.g., memory section B) for inter-section data movement. The fourth-type data transfer circuit 208 includes a second-type sensing buffer circuit 2024. The second-type sensing buffer circuit 2024 includes a BLSA and a data interface DI. The BLSA of the second-type sensing buffer circuit 2024 is coupled to a bit-line or bit-line pair of a memory section A and a bit-line or a bit-line pair of a memory section B adjacent to the memory section A. The BLSA is also coupled to the data interface DI. The data interface (DI) of the second-type sensing buffer circuit 2024 may serve as a direct or selective/multiplexed interface for communication with a circuit connected to a signal interface other than the bit-line or bit-line pair. This circuit may be any internal or external circuit of the memory device 10. For example, this circuit may be a core logic circuit for further arithmetic operation or a storage device with large capacity, but not limited thereto. The data interface (DI) of the second-type sensing buffer circuit 2024 is configured to directly or selectively transfer data between the BLSA of the second-type sensing buffer circuit 2024 and a circuit connected to a signal interface other than the bit-line or bit-line pair.

Similar to operations of the BLSA of the first-type sensing buffer circuit 2022 shown in FIG. 4, the BLSA of the second-type sensing buffer circuit 2024 is configured to sense data signals on the bit-line or bit-line pair in the memory section A, and configured to latch and buffer the sensed/amplified data signals. The latched data signals may be driven and transferred to the bit-line or bit-line pair in the memory section B by the BLSA of the second-type sensing buffer circuit 2024. As such, the data signals on the bit-line or bit-line pair of the memory section A may be propagated to the bit-line or bit-line pair of the memory section B. The fourth-type data transfer circuit 208 of the data transfer circuit 200 may be considered as the data path of inter-section data movement between the memory section A and the memory section B. In an alternative embodiment, the BLSA of the second-type sensing buffer circuit 2024 may sense data signals on the bit-line or bit-line pair in the memory section A, and then latch, buffer and transfer the sensed/amplified data signals to the data interface DI, such that the data interface DI directly or selectively outputs the data signals to a circuit connected to a signal interface other than the bit-line or bit-line pair for following operation. In addition, the data interface DI of the second-type sensing buffer circuit 2024 may receive data from the coupled circuit connected to a signal interface other than the bit-line or bit-line pair and directly or selectively transmit the received data to the BLSA. The BLSA of the second-type sensing buffer circuit 2024 may transfer the received data to the coupled bit-lines or bit-line pairs in the memory sections A and/or B. As a result, the fourth-type data transfer circuit 208 of the data transfer circuit 200 may be utilized for multiplexing from the memory section to the circuit connected to a signal interface other than the bit-line or bit-line pair and writing the data from the circuit connected to a signal interface other than the bit-line or bit-line pair to the memory section for off-bit-line data transition. Therefore, the fourth-type data transfer circuit 208 may be utilized not only for inter-section data movement, but also for off-bit-line data transition.

Figure 8:
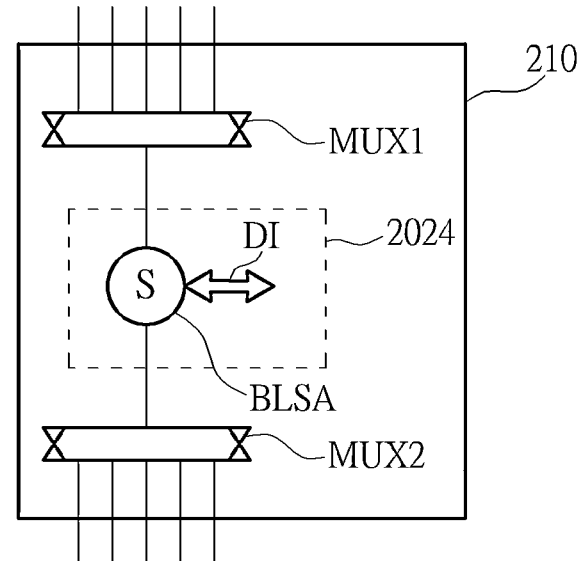
FIG. 8 is a schematic diagram of a fifth-type data transfer circuit according to an embodiment of the present invention.

In an alternative embodiment, the data transfer circuit 200 may include a plurality of fifth-type data transfer circuits 210 for inter-section data movement. Please refer FIG. 8. FIG. 8 is a schematic diagram of a fifth-type data transfer circuit 210 according to an embodiment of the present invention. Please note that the units in the fifth-type data transfer circuit 210 shown in FIG. 8 with the same designations as those in the second-type data transfer circuit 204 shown in FIG. 5 have similar operations and functions. The interconnections of the units can be referred from FIG. 8 and further description thereof is omitted for brevity. As shown in FIG. 8, the fifth-type data transfer circuit 210 may be utilized to perform data movement operation to transfer data signals from a memory section (e.g., memory section A) to a neighboring memory section (e.g., memory section B) for inter-section data movement. The fifth-type data transfer circuit 210 includes a second-type sensing buffer circuit 2024, a first multiplexer MUX1 and a second multiplexer MUX2. The second-type sensing buffer circuit 2024 includes a BLSA and a data interface DI. The BLSA of the second-type sensing buffer circuit 2024 is coupled to the first multiplexer MUX1 and the second multiplexer MUX2. The first multiplexer MUX1 is coupled to a first number of bit-lines or bit-line pairs of a memory section A and the BLSA. The second multiplexer MUX2 is coupled to a second number of bit-lines or bit-line pairs of a memory section B adjacent to the memory section A and the BLSA.

Similar to operations of the BLSA of the first-type sensing buffer circuit 2022, the first multiplexer MUX1 and the second multiplexer MUX2 shown in FIG. 5, the BLSA of the second-type sensing buffer circuit 2024 shown in FIG. 8 is configured to sense data signals on the selected bit-line or bit-line pair in the memory section A through connection operations of the first multiplexer MUX1, and configured to latch and buffer the sensed/amplified data signals. After that, the BLSA of the second-type sensing buffer circuit 2024 is configured to drive and transfer the latched data signals to the selected bit-line or bit-line pair in the memory section B through connection operations of the second multiplexer MUX2. Therefore, the data signals on the selected set of bit-lines or bit-line pairs of the memory section A may be propagated to the selected set of bit-lines or bit-line pairs of the memory section B by the fifth-type data transfer circuit 210. The fifth-type data transfer circuit 210 of the data transfer circuit 200 may be considered as a multiplexed data path of inter-section data movement between the memory section A and the memory section B.

Moreover, the BLSA is also coupled to the data interface DI of the second-type sensing buffer circuit 2024. The data interface DI of the second-type sensing buffer circuit 2024 may serve as an interface for direct or selective communication with a circuit connected to a signal interface other than the bit-line or bit-line pair. The data interface DI of the second-type sensing buffer circuit 2024 is configured to directly or selectively transfer data from the BLSA of the second-type sensing buffer circuit 2024 to a circuit connected to a signal interface other than the bit-line or bit-line pair or directly or selectively transfer data from the circuit connected to a signal interface other than the bit-line or bit-line pair to the BLSA of the second-type sensing buffer circuit 2024. The data signals on the selected bit-line or bit-line pair of the memory section A may be sensed, latched, buffered and transferred to the data interface DI by the BLSA, such that the data interface DI may directly or selectively output the data signals to a circuit connected to a signal interface other than the bit-line or bit-line pair for the following operation. In addition, the data interface DI may directly or selectively receive data from the coupled circuit connected to a signal interface other than the bit-line or bit-line pair and transmit the received data to the BLSA. The BLSA may transfer the received data to the coupled bit-line or bit-line pair in the memory section A and/or B. The fifth-type data transfer circuits 210 of the data transfer circuit 200 may be utilized for multiplexing from the memory sections to the circuit connected to a signal interface other than the bit-line or bit-line pair and writing the data from the circuit connected to a signal interface other than the bit-line or bit-line pair to the memory section for off-bit-line data transition. Therefore, the fifth-type data transfer circuit 210 may be utilized not only for inter-section data movement, but also for off bit-line data transition.

Figure 9:
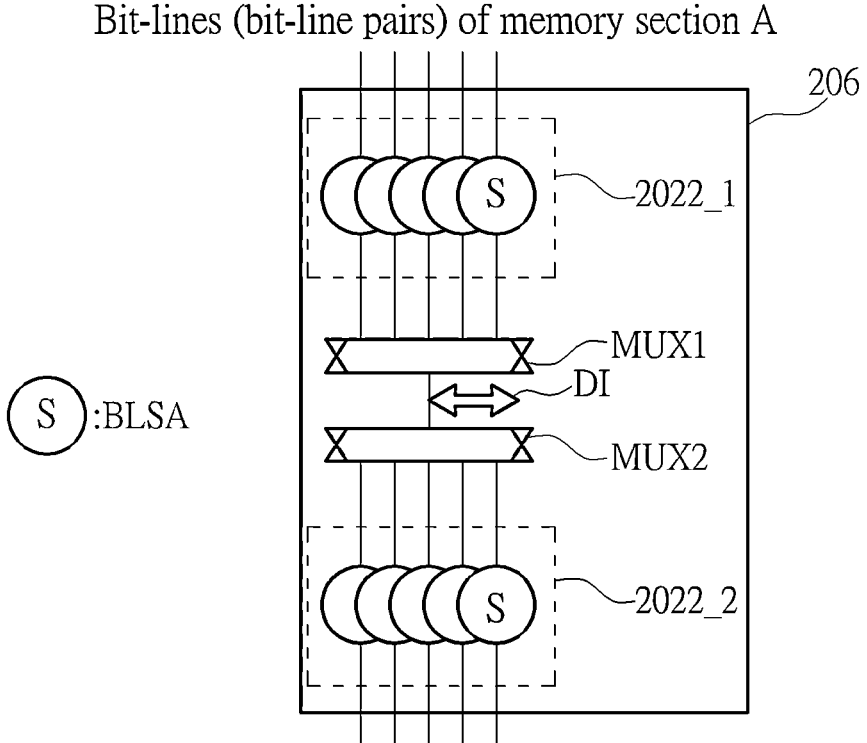
FIG. 9 is a schematic diagram of the third-type data transfer circuit according to an alternative embodiment of the present invention.

In an alternative embodiment, please refer FIG. 9. FIG. 9 is a schematic diagram of the third-type data transfer circuit 206 according to an alternative embodiment of the present invention. Please note that the units in the third-type data transfer circuit 206 shown in FIG. 9 with the same designations as those in the third-type data transfer circuit 206 shown in FIG. 6 have similar operations and functions. The interconnections of the units can be referred from FIG. 9 and further description thereof is omitted for brevity. Compared with the third-type data transfer circuit 206 shown in FIG. 6, the third-type data transfer circuit 206 further includes a data interface DI. As shown in FIG. 9, the first multiplexer MUX1 is coupled to the BLSAs of the first-type sensing buffer circuit 2022_1 and the data interface DI. The first multiplexer MUX1 is configured to select a set of BLSAs from the BLSAs of the first-type sensing buffer circuit 2022_1, and connect the selected set of BLSAs of the first-type sensing buffer circuit 2022_1 to the second multiplexer MUX2 or/and the data interface DI.

As shown in FIG. 9, the third-type data transfer circuit 206 may be utilized to perform data movement operation to transfer data signals from a memory section (e.g., memory section A) to a neighboring memory section (e.g., memory section B) for inter-section data movement. Similar to operations of the selected set of BLSAs of the first-type sensing buffer circuits 2022_1 and 2022_2, the first multiplexer MUX1 and the second multiplexer MUX2 shown in FIG. 6, the first multiplexer MUX1 is configured to select a set of BLSAs from the BLSAs of the first-type sensing buffer circuit 2022_1 and connect the selected set of BLSAs of the first-type sensing buffer circuit 2022_1 to the second multiplexer MUX2. Data signals on bit-lines or bit-line pairs coupled to the selected set of first BLSAs in the memory section A are sensed, latched, and buffered by the selected set of BLSAs of the first-type sensing buffer circuit 2022_1, and the latched data signals are driven and transferred to the selected set of BLSAs of the first-type sensing buffer circuit 2022_2 by the selected set of BLSAs of the first-type sensing buffer circuit 2022_1 through connection operations of the first multiplexer MUX1 and the second multiplexer MUX2. The data signals are then driven and transferred to bit-lines or bit-line pairs coupled to the selected set of BLSAs of the first-type sensing buffer circuit 2022_2 in the memory section B by the selected set of the first-type sensing buffer circuit 2022_2. The third-type data transfer circuit 206 of the data transfer circuit 200 may be considered as the data path of inter-section data movement between the memory section A and the memory section B.

In an alternative embodiment, as shown in FIG. 9, the first multiplexer MUX1 is configured to select a set of BLSAs from the BLSAs of the first-type sensing buffer circuit 2022_1 and connect the selected set of BLSAs of the first-type sensing buffer circuit 2022_1 to the data interface DI. Data signals on bit-lines or bit-line pairs coupled to the selected set of BLSAs of the first-type sensing buffer circuit 2022_1 in the memory section A are sensed, latched, buffered, and transferred to the data interface DI through connection operations of the first multiplexer MUX1 by the selected set of BLSAs of the first-type sensing buffer circuit 2022_1. The data interface DI may directly or selectively output the data signals to a circuit connected to a signal interface other than the bit-line or bit-line pair for the following operation. In addition, the data interface DI may directly or selectively receive data from the coupled circuit connected to a signal interface other than the bit-line or bit-line pair and transmit the received data to a selected set of BLSAs of the first-type sensing buffer circuits 2022_1, 2022_2 through connection operations of the first multiplexer MUX1 and the second multiplexer MUX2, such that the selected set of BLSAs of the first-type sensing buffer circuits 2022_1, 2022_2 may transfer the received data to the coupled bit-line or bit-line pair in the memory sections A and/or B. The third-type data transfer circuit 206 of the data transfer circuit 200 may be utilized for multiplexing from the memory sections to the circuit connected to a signal interface other than the bit-line or bit-line pair and writing the data from the circuit connected to a signal interface other than the bit-line or bit-line pair to the memory section for off-bit-line data transition. Therefore, the third-type data transfer circuit 206 may be utilized not only for inter-section data movement, but also for off bit-line data transition.

Figure 10:
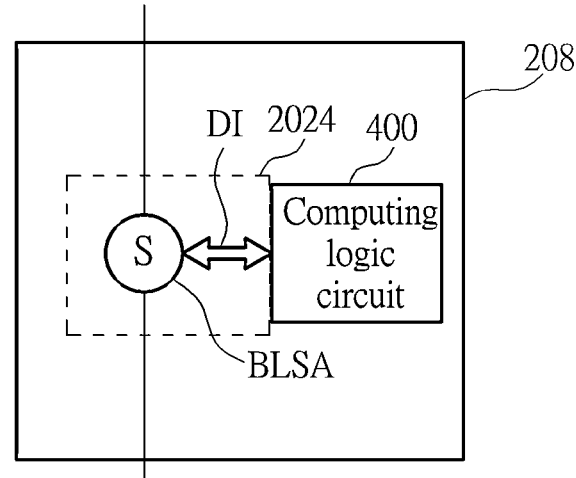
FIG. 10 is a schematic diagram of the fourth-type data transfer circuit according to an alternative embodiment of the present invention.

In an alternative embodiment, please refer FIG. 10. FIG. 10 is a schematic diagram of the fourth-type data transfer circuit 208 according to an alternative embodiment of the present invention. Please note that the units in the fourth-type data transfer circuit 208 shown in FIG. 10 with the same designations as those in the fourth-type data transfer circuit 208 shown in FIG. 7 have similar operations and functions. Compared with the fourth-type data transfer circuit 208 shown in FIG. 7, the fourth-type data transfer circuit 208 further includes a computing logic circuit 400. For example, the computing logic circuit 400 may include a NOR gate, a systolic array, a multiplication and adder tree (MUL/Adder tree) circuit an accumulator (ACC) and/or an activation arithmetic circuit, but not limited thereto. The computing logic circuit 400 may be integrated into the data transfer circuit 200. The fourth-type data transfer circuit 208 may be utilized for a data path of inter-section data movement between the memory section A and the memory section B. The computing logic circuit 400 is directly or selectively coupled to the data interface DI. Data signals on the bit-line or bit-line pair in the memory section A may be sensed, latched, and buffered by the BLSA of the second-type sensing buffer circuit 2024. The latched data signals may be driven and transferred to the data interface DI. The data interface DI may directly or selectively drive and transfer the data signals to the computing logic circuit 400 for further arithmetic calculation. Alternatively, the data interface DI of the second-type sensing buffer circuit 2024 may directly or selectively receive data from the computing logic circuit 400 and transmit the received data to the BLSA. The BLSA may transfer the received data to the coupled bit-line or bit-line pair in the memory section A. Therefore, the fourth-type data transfer circuits 208 may be utilized not only for inter-section data movement, but also for transition to associated computing logic circuit.

Figure 11:
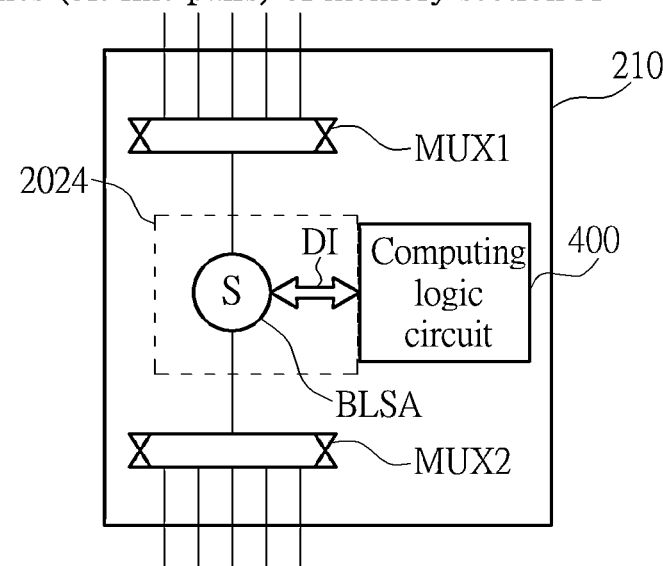
FIG. 11 is a schematic diagram of the fifth-type data transfer circuit according to an alternative embodiment of the present invention.
Figure 12:
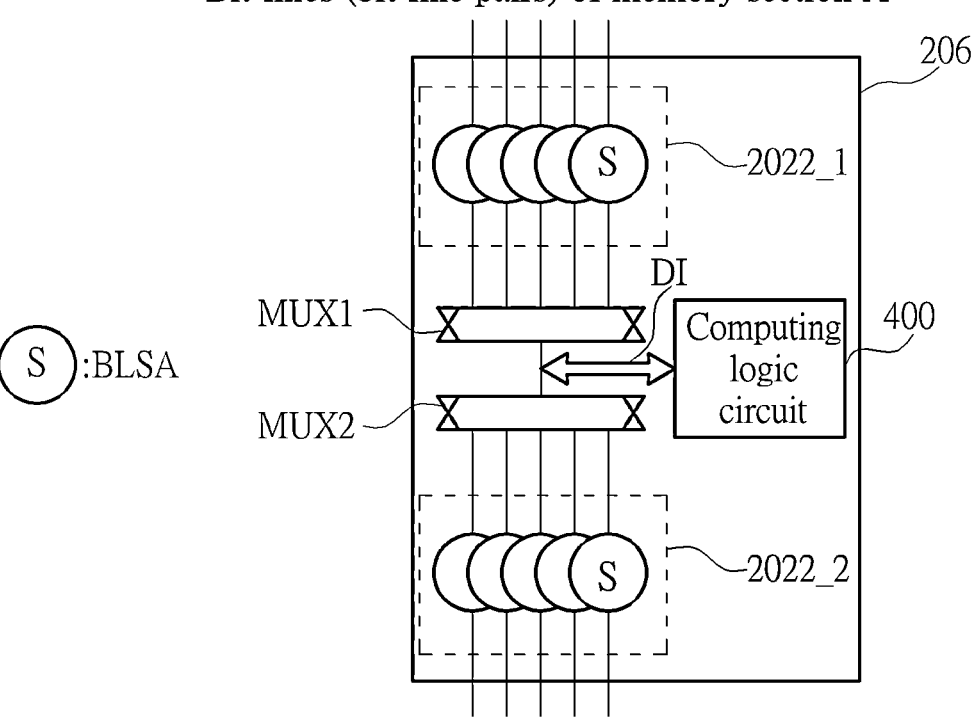
FIG. 12 is a schematic diagram of the third-type data transfer circuit according to an alternative embodiment of the present invention.

In an alternative embodiment, please refer FIG. 11 and FIG. 12. FIG. 11 is a schematic diagram of the fifth-type data transfer circuit 210 according to an alternative embodiment of the present invention. FIG. 12 is a schematic diagram of the third-type data transfer circuit 206 according to an alternative embodiment of the present invention. Please note that the units in the fifth-type data transfer circuit 210 shown in FIG. 11 with the same designations as those in the fifth-type data transfer circuit 210 shown in FIG. 8 have similar operations and functions. The units in the third-type data transfer circuit 206 shown in FIG. 12 with the same designations as those in the third-type data transfer circuit 206 shown in FIG. 9 have similar operations and functions. As shown in FIG. 11 and FIG. 12, both of the fifth-type data transfer circuit 210 shown in FIG. 11 and the third-type data transfer circuit 206 shown in FIG. 12 further include a computing logic circuit 400. The fifth-type data transfer circuit 210 shown in FIG. 11 and the third-type data transfer circuit 206 shown in FIG. 12 may be utilized for data path of inter-section data movement between the memory section A and the memory section B. Data signals on the bit-line or bit-line pair in the memory section A may be sensed and transferred to the computing logic circuit 400 via the data interface DI. Calculation results of the computing logic circuit 400 may be transferred to the memory section via the data interface DI. Therefore, the fifth-type data transfer circuit 210 shown in FIG. 11 and the third-type data transfer circuit 206 shown in FIG. 12 may be utilized not only for inter-section data movement, but also for off bit-line transition to associated computing logic circuit.

Figure 13:
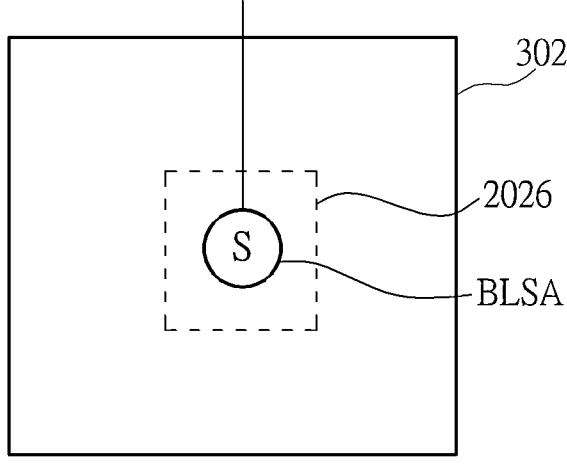
FIG. 13 is a schematic diagram of a first-type interface transfer circuit according to an embodiment of the present invention.

The memory device 10 includes a plurality of interface transfer circuit 300, and each interface transfer circuit 300 is coupled a memory section 102. All or part of the variant types of the interface circuits 300 among the multiple-section memory array can be operated in serial or parallel. The interface transfer circuit 300 may include a plurality of first-type interface transfer circuits 302. Please refer FIG. 13. FIG. 13 is a schematic diagram of a first-type interface transfer circuit 302 according to an embodiment of the present invention. As shown in FIG. 13, the first-type interface transfer circuit 302 may be utilized for data sensing and buffering. The first-type interface transfer circuit 302 includes a third-type sensing buffer circuit 2026. The third-type sensing buffer circuit 2026 includes a BLSA. The BLSA of the third-type sensing buffer circuit 2026 is coupled to a bit-line or bit-line pair of a memory section A. The BLSA of the third-type sensing buffer circuit 2026 is configured to sense data signals on the bit-line or bit-line pair in the memory section A, and configured to latch and buffer the sensed/amplified data signals for data sensing and buffering.

Figure 14:
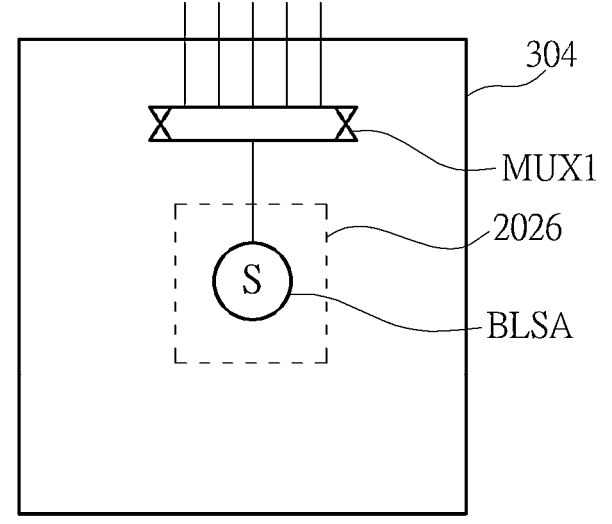
FIG. 14 is a schematic diagram of a second-type interface transfer circuit according to an embodiment of the present invention.

In an alternative embodiment, the interface transfer circuit 300 may include a plurality of second-type interface transfer circuits 304. Please refer FIG. 14. FIG. 14 is a schematic diagram of a second-type interface transfer circuit 304 according to an embodiment of the present invention. As shown in FIG. 14, the second-type interface transfer circuit 304 may be utilized for data sensing and buffering. The second-type interface transfer circuit 304 includes a third-type sensing buffer circuit 2026 and a first multiplexer MUX1. The third-type sensing buffer circuit 2026 includes a BLSA. The first multiplexer MUX1 is coupled to a first number of bit-lines or bit-line pairs of a memory section A and the BLSA of the third-type sensing buffer circuit 2026. The first multiplexer MUX1 is configured to select a set of bit-lines or bit-line pairs of the memory section A from the first number of bit-lines or bit-line pairs of the memory section A, and connect the selected set of bit-lines or bit-line pairs of the memory section A to the BLSA of the third-type sensing buffer circuit 2026. Data signals on the selected set of bit-lines or bit-line pairs in the memory section A are sensed, latched, and buffered by the third-type sensing buffer circuit 2026 through connection operations of the first multiplexer MUX1 for data sensing and buffering.

Figure 15:
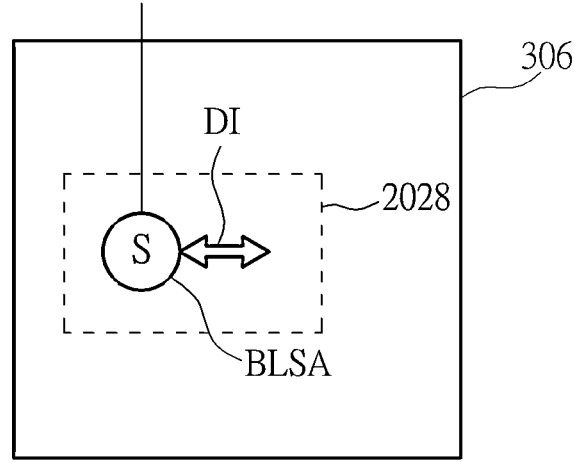
FIG. 15 is a schematic diagram of a third-type interface transfer circuit according to an embodiment of the present invention.

In an alternative embodiment, the interface transfer circuit 300 may include a plurality of third-type interface transfer circuits 306. Please refer FIG. 15. FIG. 15 is a schematic diagram of a third-type interface transfer circuit 306 according to an embodiment of the present invention. As shown in FIG. 15, the third-type interface transfer circuit 306 may be utilized for off-bit-line data transition of edge memory section. The third-type interface transfer circuit 306 includes a fourth-type sensing buffer circuit 2028. The fourth-type sensing buffer circuit 2028 includes a BLSA and a data interface DI. The BLSA of the fourth-type sensing buffer circuit 2028 is coupled to a bit-line or bit-line pair of an edge memory section (e.g., memory section A) and the data interface DI other than the bit-line or bit-line pair. The data interface DI of the fourth-type sensing buffer circuit 2028 facilitates data transition between the BLSA and other connected circuits.

As shown in FIG. 15, the BLSA of the fourth-type sensing buffer circuit 2028 is configured to sense data signals on the bit-line or bit-line pair in the memory section A, and configured to latch and buffer the sensed/amplified data signals. The latched data signals may be driven and transferred to the data interface DI by the BLSA, such that, the data interface DI outputs the data signals to a circuit other than the BLSA for following operation. Alternatively, the data interface DI of the fourth-type sensing buffer circuit 2028 may receive data from the coupled circuit and transmit the received data to the BLSA. The BLSA of the fourth-type sensing buffer circuit 2028 may transfer the received data to the coupled bit-line or bit-line pair in the memory section A. Therefore, the third-type interface transfer circuit 306 within interface transfer circuit 300 enables data transfer between the edge memory section and a connected circuit.

Figure 16:
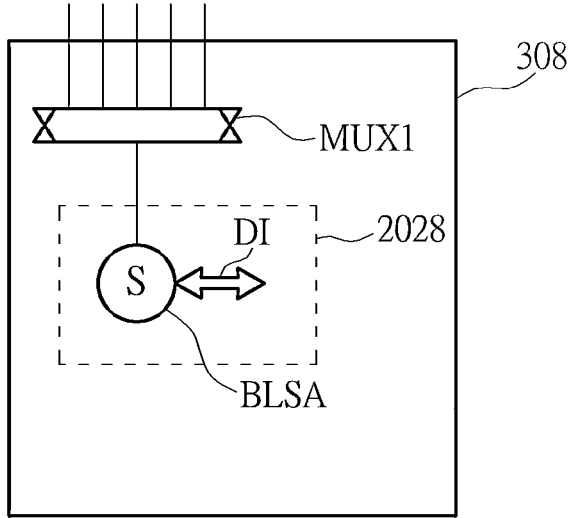
FIG. 16 is a schematic diagram of a fourth-type interface transfer circuit according to an embodiment of the present invention.

In an alternative embodiment, the interface transfer circuit 300 may include a plurality of fourth-type interface transfer circuits 308. Please refer FIG. 16. FIG. 16 is a schematic diagram of a fourth-type interface transfer circuit 308 according to an embodiment of the present invention. As shown in FIG. 16, the fourth-type interface transfer circuit 308 may be utilized for off-bit-line data transition of edge memory section. The fourth-type interface transfer circuit 308 includes a fourth-type sensing buffer circuit 2028 and a first multiplexer MUX1. The fourth-type sensing buffer circuit 2028 includes a BLSA and a data interface DI. The BLSA of the fourth-type sensing buffer circuit 2028 is coupled to the first multiplexer MUX1 and the data interface DI. The first multiplexer MUX1 is coupled to bit-lines or bit-line pairs of an edge memory section (e.g., memory section A). Therefore, the data interface DI of the fourth-type sensing buffer circuit 2028 enables data transfer between the edge memory section and a connected circuit. The first multiplexer MUX1 is configured to select a set of bit-lines or bit-line pairs of the memory section A from the first number of bit-lines or bit-line pairs of the memory section A, and connect the selected set of bit-lines or bit-line pairs of the memory section A to the BLSA of the fourth-type sensing buffer circuit 2028. The data signals on the selected bit-line or bit-line pair of the memory section A may be sensed, latched, buffered, and transferred to the data interface DI by the BLSA, such that the data interface DI may output the data signals to a coupled circuit other than the BLSA for following operation. The data interface DI may receive data from the coupled circuit other than the BLSA and transmit the received data to the BLSA. The BLSA may transfer the received data to the coupled bit-line or bit-line pair in the memory section A. Therefore, the fourth-type interface transfer circuit 308 of the interface transfer circuit 300 may be utilized for multiplexing data from the edge memory section to the circuit connected to it and selectively writing the data from the circuit to the bit-line or bit-line pair of the edge memory section.

Figure 17:
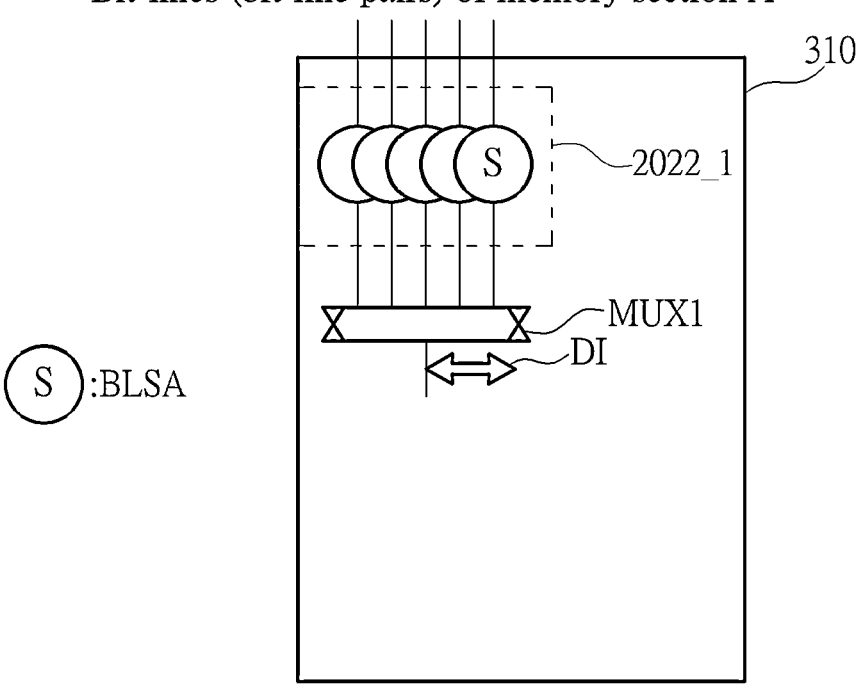
FIG. 17 is a schematic diagram of a fifth-type interface transfer circuit according to an embodiment of the present invention.

In an alternative embodiment, the interface transfer circuit 300 may include a plurality of fifth-type interface transfer circuits 310. Please refer FIG. 17. FIG. 17 is a schematic diagram of a fifth-type interface transfer circuit 310 according to an embodiment of the present invention. As shown in FIG. 17, the fifth-type interface transfer circuit 310 may be utilized for off-bit-line data transition of edge memory section. The fifth-type interface transfer circuit 310 includes a first-type sensing buffer circuit 2022_1, a first multiplexer MUX1 and a data interface DI. The first-type sensing buffer circuit 2022_1 includes a plurality of BLSAs, and each BLSA of the first-type sensing buffer circuit 2022_1 is coupled to a bit-line or bit-line pair of a memory section A. The first-type sensing buffer circuit 2022_1 includes a plurality of BLSAs, and each BLSA of the first-type sensing buffer circuit 2022_1 is coupled to a bit-line or bit-line pair of an edge memory section (e.g., memory section A). The first multiplexer MUX1 is coupled to the BLSAs of the first-type sensing buffer circuit 2022_1. The first multiplexer MUX1 is configured to select a set of BLSAs from the BLSAs of the first-type sensing buffer circuit 2022_1, and connect the selected set of BLSAs of the first-type sensing buffer circuit 2022_1 to the data interface DI. The data interface DI may serve as an interface for communication with a circuit other than the BLSAs. Data signals on bit-lines or bit-line pairs coupled to the selected set of BLSAs of the first-type sensing buffer circuit 2022_1 in the memory section A are sensed, latched, buffered and transferred to the data interface DI through connection operations of the first multiplexer MUX1 by the selected set of BLSAs of the first-type sensing buffer circuit 2022_1. The data interface DI may output the data signals to a circuit other than the BLSAs for the following operation. The data interface DI may receive data from the coupled circuit other than the BLSAs and transmit the received data to a selected set of BLSAs of the first-type sensing buffer circuit 2022_1 through connection operations of the first multiplexer MUX1, such that the selected set of BLSAs of the first-type sensing buffer circuit 2022_1 may transfer the received data to the coupled bit-line or bit-line pair in the memory section A. Therefore, the fifth-type interface transfer circuit 310 of the interface transfer circuit 300 may be utilized for multiplexing from the edge memory section to the circuit other than the BLSAs and writing the data from the circuit other than the BLSAs to the edge memory section for off-bit-line data transition of edge memory section.

Figure 18:
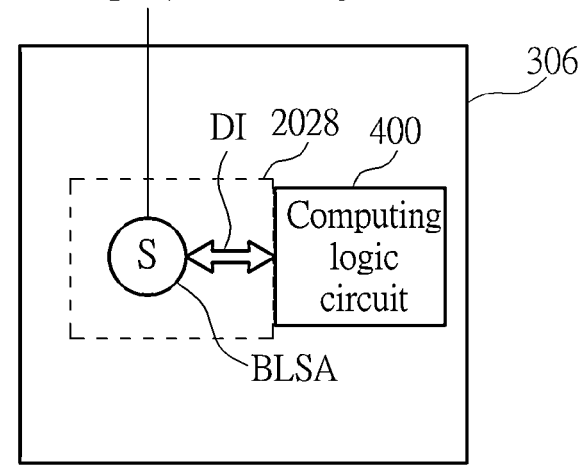
FIG. 18 is a schematic diagram of the third-type interface transfer circuit according to an alternative embodiment of the present invention.

In an alternative embodiment, please refer FIG. 18. FIG. 18 is a schematic diagram of the third-type interface transfer circuit 306 according to an alternative embodiment of the present invention. Please note that the units in the third-type interface transfer circuit 306 shown in FIG. 18 with the same designations as those in the third-type interface transfer circuits 306 shown in FIG. 15 have similar operations and functions. The interconnections of the units can be referred from FIG. 18 and further description thereof is omitted for brevity. Compared with the third-type interface transfer circuit 306 shown in FIG. 15, the third-type interface transfer circuit 306 further includes a computing logic circuit 400. Please further refer to FIG. 1 and FIG. 18. The computing logic circuit 400 may be integrated into the interface transfer circuit 300. For example, the computing logic circuit 400 include NOR gates, systolic arrays, multiplication adder tree (MUL/Adder tree) circuits, accumulators (ACCs) and/or activation arithmetic circuits, but not limited thereto. The computing logic circuit 400 is coupled to the data interface DI. Data signals on the bit-line or bit-line pair in an edge memory section (e.g., memory section A) may be sensed, latched, and buffered by the BLSA of the fourth-type sensing buffer circuit 2028. The latched data signals may be driven and transferred to the data interface DI by the BLSA. Further, the data interface DI may drive and transfer the data signals to the computing logic circuit 400 for further arithmetic calculation. Therefore, data signals on the bit-line or bit-line pair in the edge memory section A may be multiplexed from the edge memory section A to the computing logic circuit 400 for further arithmetic calculation. For example, as shown in FIG. 1, the computing logic circuit 400 includes a multiplication adder tree (MUL/Adder tree) circuit 402 and an accumulator (ACC) or activation arithmetic circuit 404. Data signals on the bit-line or bit-line pair in an edge memory section 102 may be multiplexed from the edge memory section 102 to the multiplication adder tree 402 for further arithmetic calculation through the third-type interface transfer circuit 306 of the interface transfer circuit 300.

Alternatively, as shown in FIG. 18, the data interface DI of the fourth-type sensing buffer circuit 2028 may receive data from the computing logic circuit 400 and transmit the received data to the BLSA. The BLSA may transfer the received data to the coupled bit-line or bit-line pair in the memory section A. For example, as shown in FIG. 1, data of calculation results of the accumulator or activation arithmetic circuit 404 may be written into the edge memory section by the coupled the interface transfer circuit 300. Therefore, the third-type interface transfer circuit 306 of the interface transfer circuit 300 may be utilized for multiplexing from the edge memory section to the computing logic circuit 400 and writing the data of calculation results from the computing logic circuit 400 to the edge memory section for off-bit-line data transition to associated computing logic circuit of edge memory section.

Figure 19:
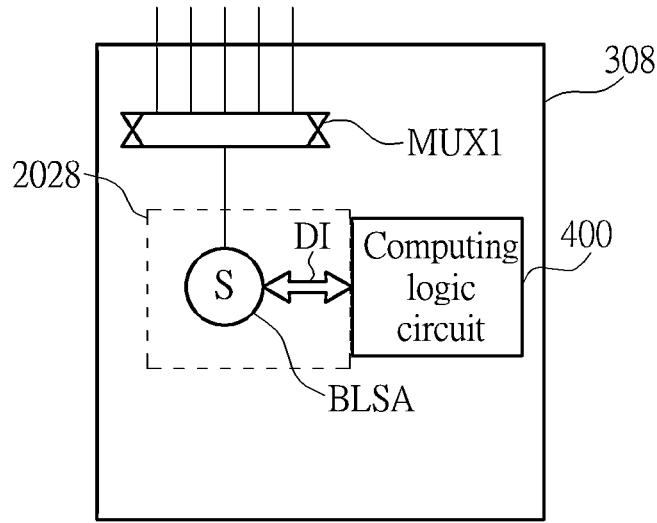
FIG. 19 is a schematic diagram of the fourth-type interface transfer circuit according to an alternative embodiment of the present invention.

In an alternative embodiment, please refer FIG. 19. FIG. 19 is a schematic diagram of the fourth-type interface transfer circuit 308 according to an alternative embodiment of the present invention. Please note that the units in the fourth-type interface transfer circuit 308 shown in FIG. 19 with the same designations as those in the fourth-type interface transfer circuit 308 shown in FIG. 16 have similar operations and functions. The interconnections of the units can be referred from FIG. 19 and further description thereof is omitted for brevity. Compared with the fourth-type interface transfer circuit 308 of FIG. 16, the fourth-type interface transfer circuit 308 further includes a computing logic circuit 400. The computing logic circuit 400 is coupled to the data interface DI. Data signals on the selected bit-line or bit-line pair of the memory section A may be sensed, latched, buffered and transferred to the data interface DI by the BLSA. The data interface DI may drive and transfer the data signals to the computing logic circuit 400 for further arithmetic calculation. Alternatively, the data interface DI of the fourth-type sensing buffer circuit 2028 may receive data from the computing logic circuit 400 and transmit the received data to the BLSA. The BLSA may transfer the received data to the coupled bit-line or bit-line pair in the memory section A. Therefore, the fourth-type interface transfer circuit 308 of the interface transfer circuit 300 may be utilized for multiplexing from the edge memory section to the computing logic circuit 400 and writing the data of calculation results from the computing logic circuit 400 to the edge memory section for off-bit-line data transition to associated computing logic circuit of edge memory section.

Figure 20:
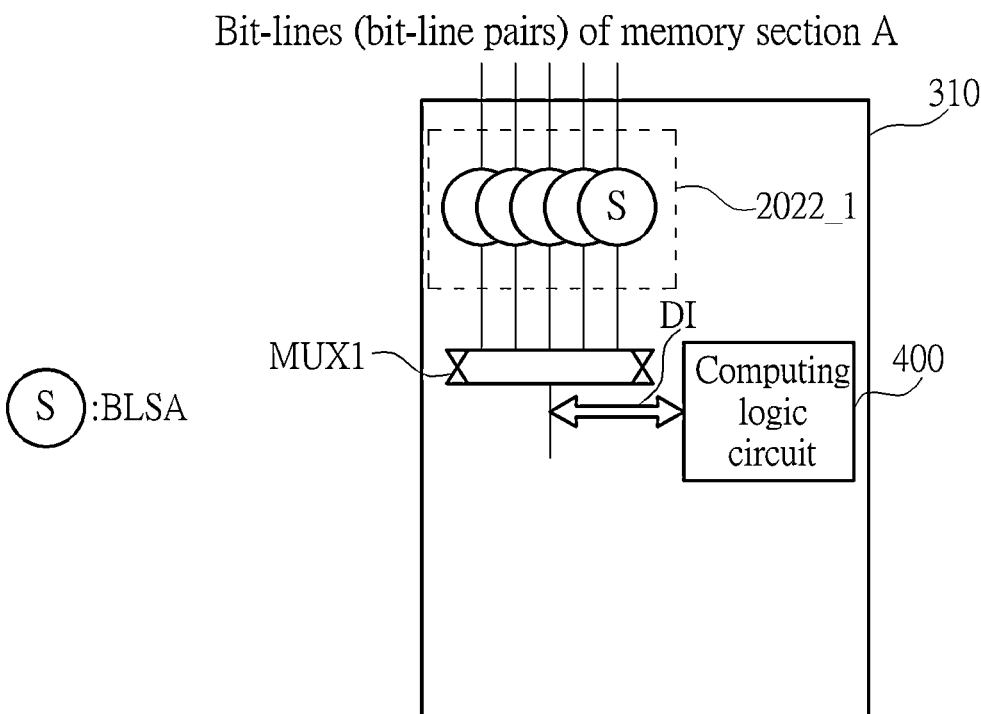
FIG. 20 is a schematic diagram of the fifth-type interface transfer circuit according to an alternative embodiment of the present invention.

In an alternative embodiment, please refer FIG. 20. FIG. 20 is a schematic diagram of the fifth-type interface transfer circuit 310 according to an alternative embodiment of the present invention. Please note that the units in the fifth-type interface transfer circuit 310 shown in FIG. 20 with the same designations as those in the fifth-type interface transfer circuit 310 shown in FIG. 17 have similar operations and functions. The interconnections of the units can be referred from FIG. 20 and further description thereof is omitted for brevity. Compared with the fifth-type interface transfer circuit 310 of FIG. 17, the fifth-type interface transfer circuit 310 further includes a computing logic circuit 400. The computing logic circuit 400 is coupled to the data interface DI. Data signals on bit-lines or bit-line pairs coupled to the selected set of BLSAs of the first-type sensing buffer circuit 2022_1 in the memory section A may be sensed, latched, buffered, and transferred to the data interface DI through connection operations of the first multiplexer MUX1 by the selected set of BLSAs of the first-type sensing buffer circuit 2022_1. The data interface DI may drive and transfer the data signals to the computing logic circuit 400 for further arithmetic calculation. In addition, the data interface DI may receive data from the computing logic circuit 400 and transmit the received data to a selected set of BLSAs of the first-type sensing buffer circuit 2022_1 through connection operations of the first multiplexer MUX1. The selected set of BLSAs of the first-type sensing buffer circuit 2022_1 may transfer the received data to the coupled bit-line or bit-line pair in the memory section A. Therefore, the fifth-type interface transfer circuit 310 of the interface transfer circuit 300 may be utilized for multiplexing from the edge memory section to the computing logic circuit 400 and writing the data of calculation results from the computing logic circuit 400 to the edge memory section for off-bit-line data transition to associated computing logic circuit of edge memory section.

Figure 21:
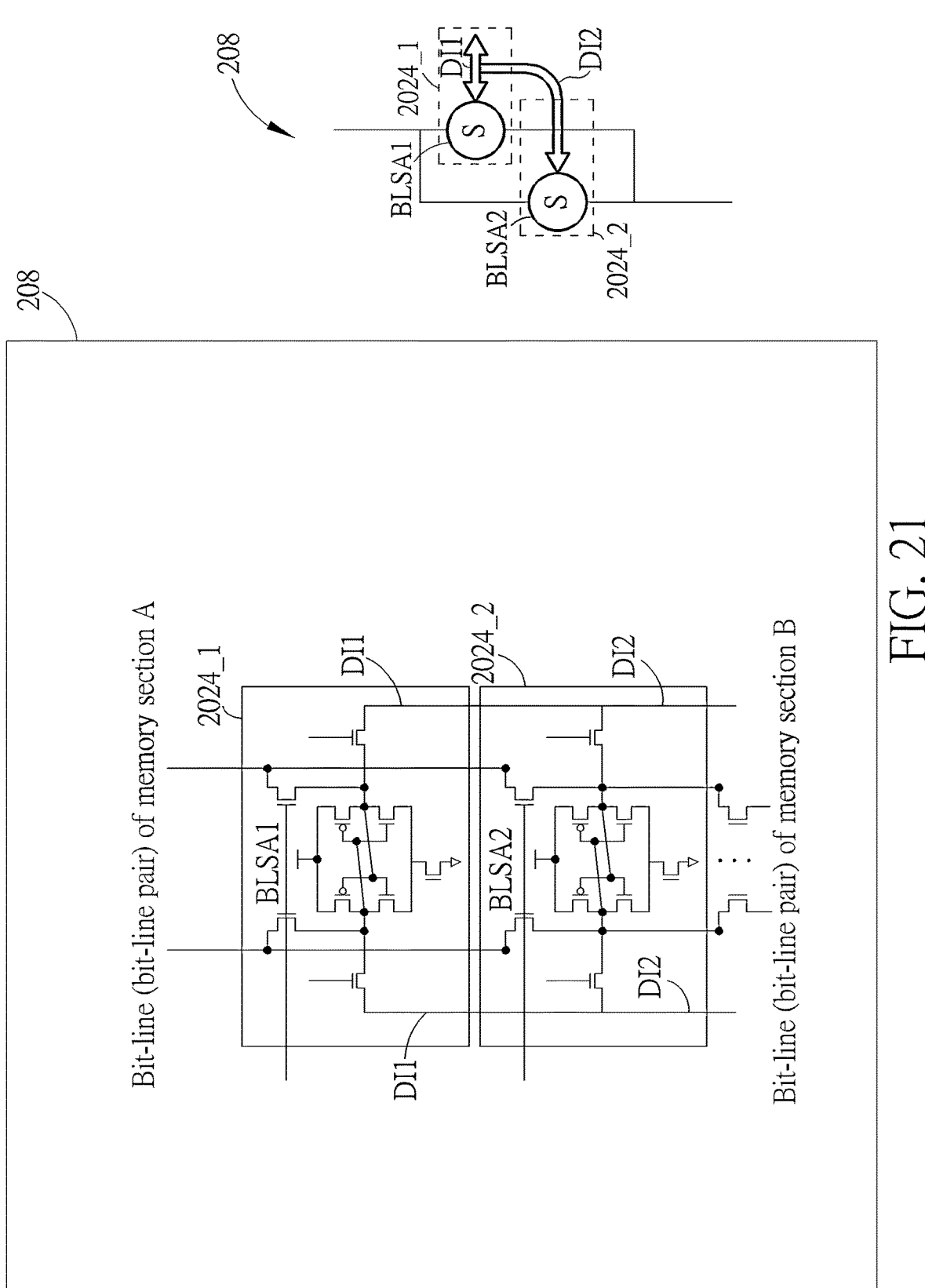
FIG. 21 is a schematic diagram of the fourth-type data transfer circuit according to an alternative embodiment of the present invention.

In an alternative embodiment, please refer FIG. 21. FIG. 21 is a schematic diagram of the fourth-type data transfer circuit 208 according to an alternative embodiment of the present invention.

An alternative design of the fourth-type data transfer circuit 208 is applied. The fourth-type data transfer circuit 208 of FIG. 21 is modified based on the second-type sensing buffer circuit 2024 of FIG. 7. FIG. 21 shows an exemplary circuit structure of the fourth-type data transfer circuit 208. The fourth-type data transfer circuit 208 shown in FIG. 21 includes a combination circuit of two second-type sensing buffer circuits of FIG. 7. As shown in FIG. 21, the fourth-type data transfer circuit 208 may include second-type sensing buffer circuits 2024_1 and 2024_2. The units in the second-type sensing buffer circuits 2024_1 and 2024_2 with the same designations as those in the second-type sensing buffer circuit 2024 shown in FIG. 7 have similar operations and functions. The interconnections of the units are as shown in FIG. 21. Both of the BLSA1 of the second-type sensing buffer circuit 2024_1 and the BLSA2 of the second-type sensing buffer circuit 2024_2 are coupled to the same bit-line or bit-line pair of the memory section (e.g., memory section A), and also coupled to the same bit-line or bit-line pair of a neighboring memory section (e.g., memory section B). The data interface DI1 of the second-type sensing buffer circuit 2024_1 is coupled or connected to the data interface DI2 of the second-type sensing buffer circuit 2024_2. Therefore, the fourth-type data transfer circuit 208 of the interface transfer circuit 300 may be utilized for simultaneous inter-section data movement and off-bit-line data transition memory section.

Figure 22:
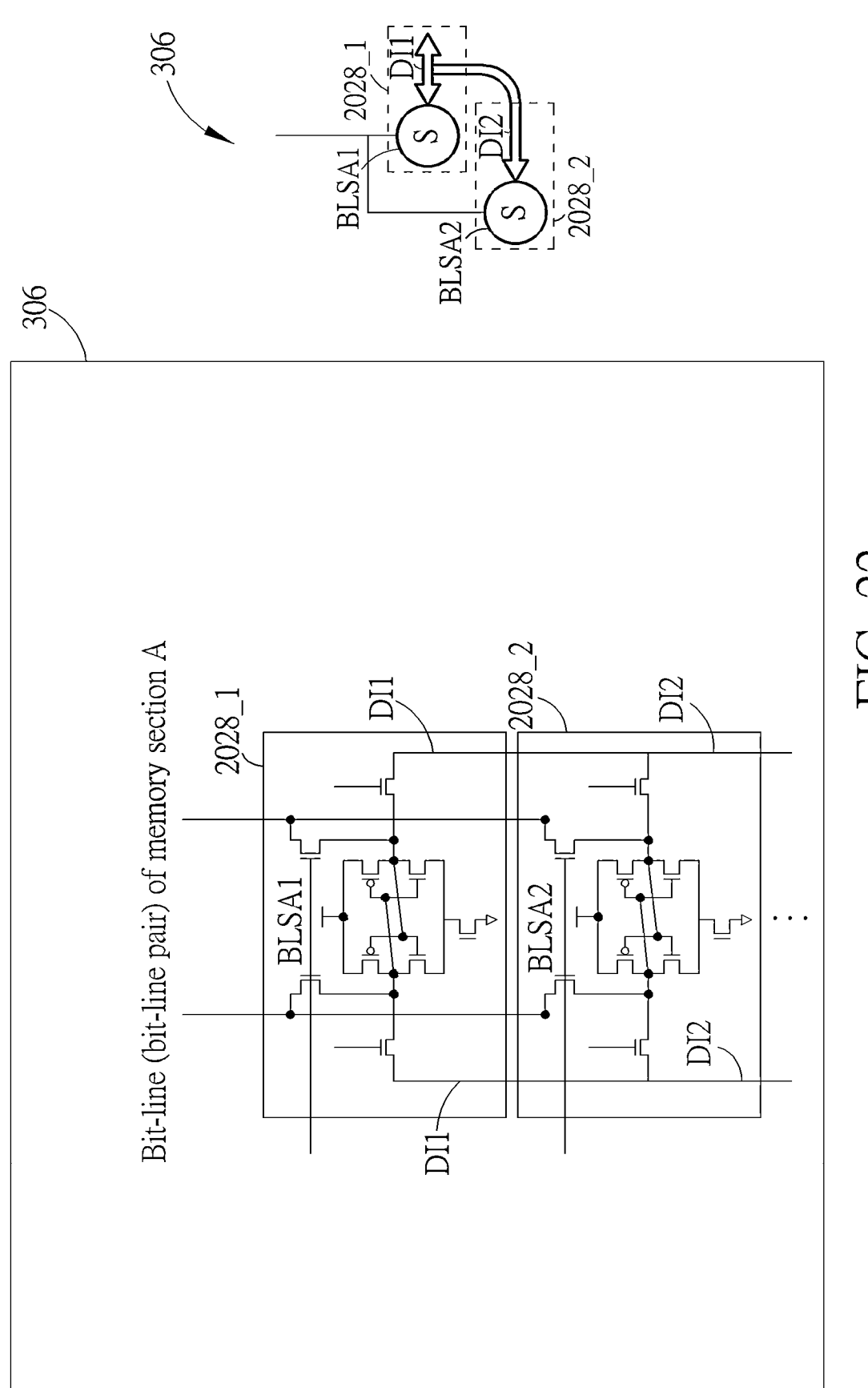
FIG. 22 and FIG. 23 are schematic diagrams of the third-type interface transfer circuit according to alternative embodiments of the present invention.

In an alternative embodiment, please refer FIG. 22. FIG. 22 is a schematic diagram of the third-type interface transfer circuit 306 according to an alternative embodiment of the present invention. An alternative design of the third-type interface transfer circuit 306 is applied. FIG. 22 shows an exemplary circuit structure of the third-type interface transfer circuit 306. The third-type interface transfer circuit 306 of FIG. 22 is modified based on the fourth-type sensing buffer circuit 2028 of FIG. 15. The third-type interface transfer circuit 306 shown in FIG. 22 includes a combination circuit of two fourth-type sensing buffer circuits of FIG. 15. As shown in FIG. 22, the third-type interface transfer circuit 306 may include fourth-type sensing buffer circuits 2028_1 and 2028_2. The units in the fourth-type sensing buffer circuits 2028_1 and 2028_2 with the same designations as those in the fourth-type sensing buffer circuit 2028 shown in FIG. 15 have similar operations and functions. The interconnections of the units are as shown in FIG. 22. The BLSA1 of the fourth-type sensing buffer circuit 2028_1 and the BLSA2 of the fourth-type sensing buffer circuit 2028_2 are coupled to the same bit-line or bit-line pair of the edge memory section (e.g., memory section A). The data interface DI1 of the fourth-type sensing buffer circuit 2028_1 is coupled or connected to the data interface DI2 of the fourth-type sensing buffer circuit 2028_2. Therefore, the third-type interface transfer circuit 306 of the interface transfer circuit 300 may be utilized for simultaneous data sensing and off-bit-line data transition of edge memory section.

Figure 23:
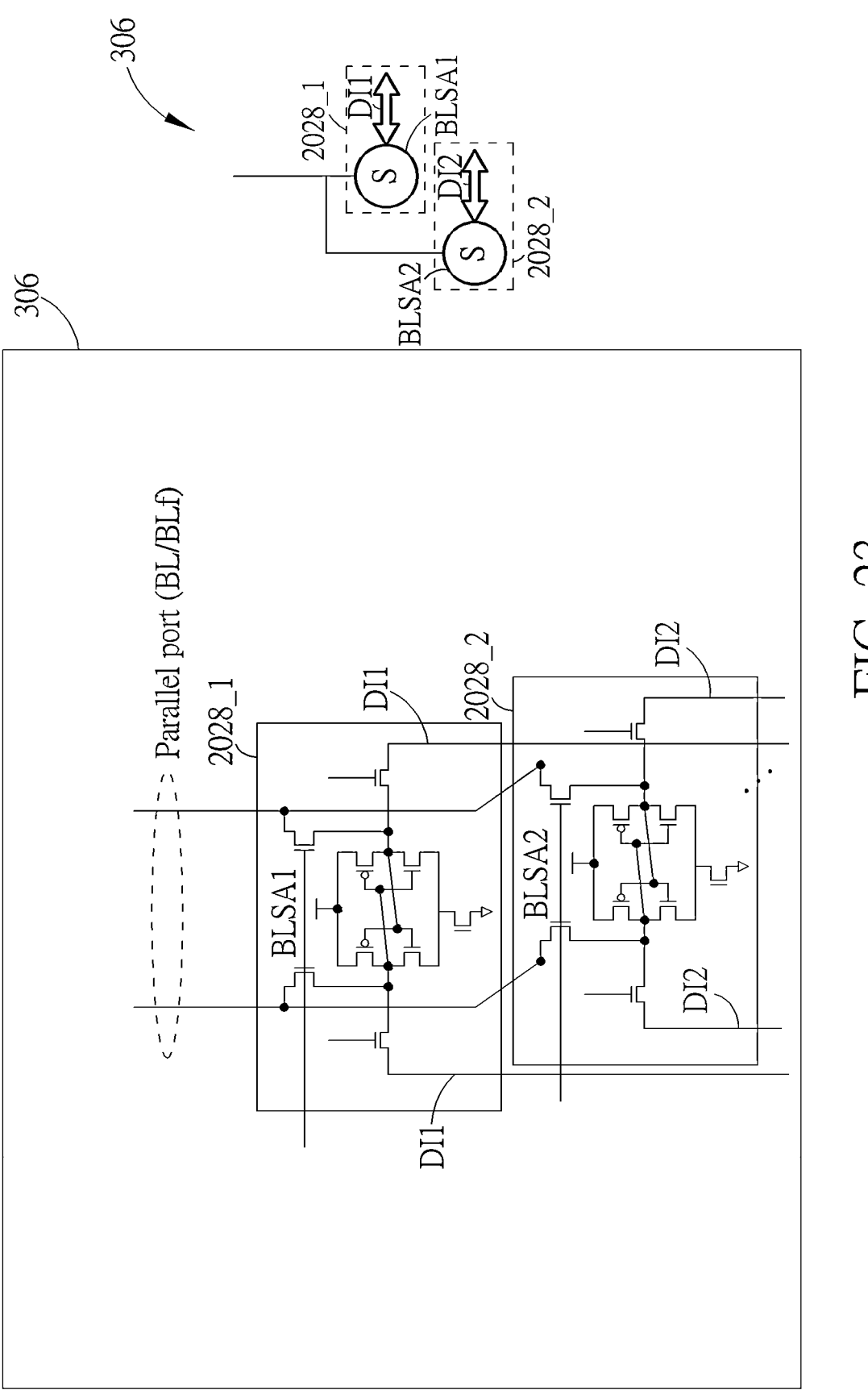

In an alternative embodiment, please refer FIG. 23. FIG. 23 is a schematic diagram of the third-type interface transfer circuit 306 according to an alternative embodiment of the present invention. Different from the third-type interface transfer circuit 306 of FIG. 22, the data interface DI1 of the fourth-type sensing buffer circuit 2028_1 is not coupled to the data interface DI2 of the fourth-type sensing buffer circuit 2028_2.

Figure 24:
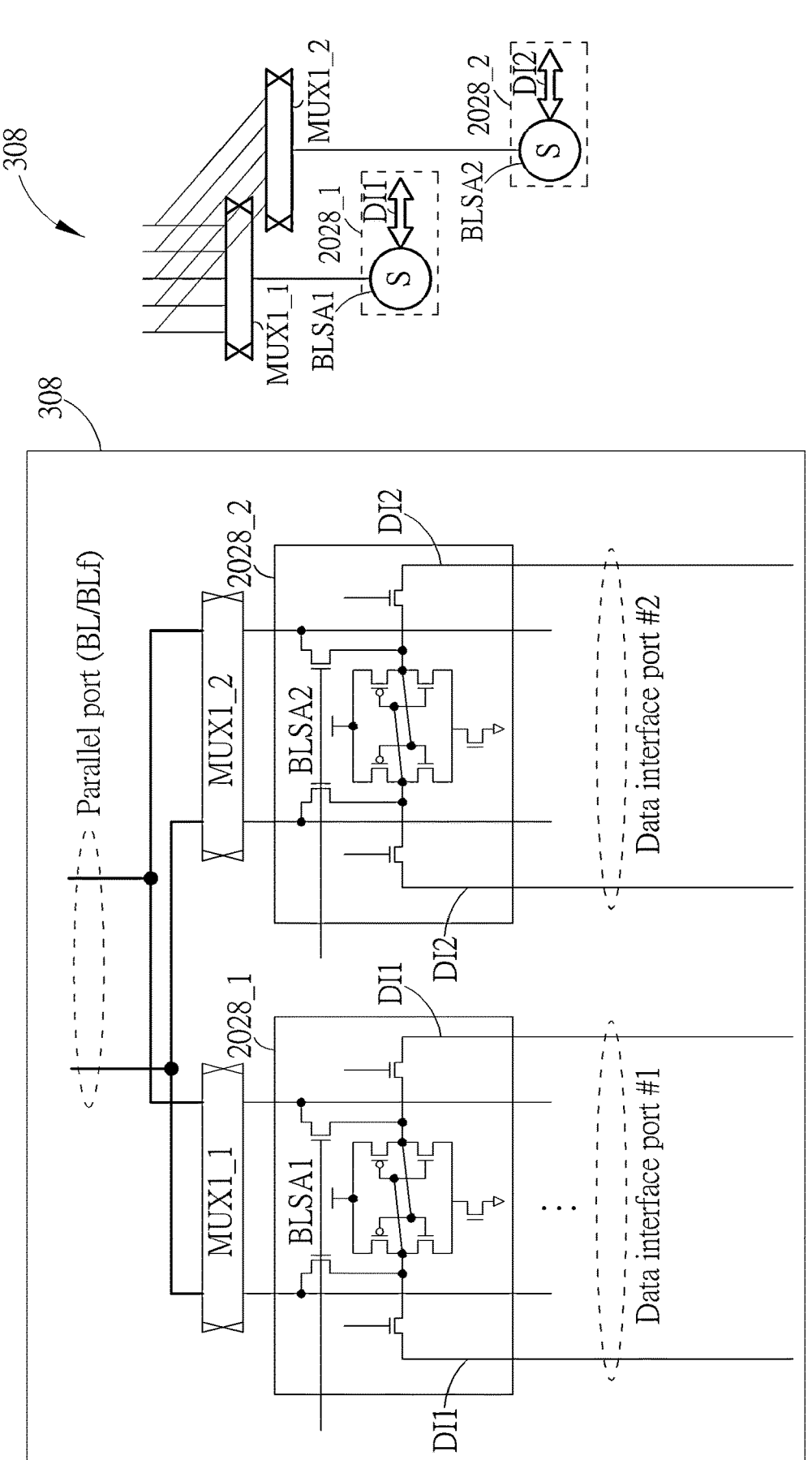
FIG. 24 is a schematic diagram of the fourth-type interface transfer circuit according to an alternative embodiment of the present invention.

In an alternative embodiment, please refer FIG. 24. FIG. 24 is a schematic diagram of the fourth-type interface transfer circuit 308 according to an alternative embodiment of the present invention. An alternative design of the fourth-type interface transfer circuit 308 is applied. FIG. 24 shows an exemplary circuit structure of the fourth-type interface transfer circuit 308. The fourth-type interface transfer circuit 308 of FIG. 24 is modified based on the fourth-type sensing buffer circuit 2028 and the fourth-type interface transfer circuit 308 of FIG. 16. The fourth-type interface transfer circuit 308 shown in FIG. 24 includes a combination circuit of two fourth-type interface transfer circuits 308 of FIG. 16. As shown in FIG. 24, the fourth-type interface transfer circuit 308 may include fourth-type sensing buffer circuits 2028_1 and 2028_2, and first multiplexers MUX1_1 and MUX1_2. The units in the fourth-type sensing buffer circuits 2028_1 and 2028_2 with the same designations as those in the fourth-type sensing buffer circuit 2028 shown in FIG. 16 have similar operations and functions. The units in the first multiplexers MUX1_1 and MUX1_2 with the same designations as those in the first multiplexer MUX1 shown in FIG. 16 have similar operations and functions. The interconnections of the units are as shown in FIG. 24. The first multiplexers MUX1_1 and MUX1_2 are coupled to the same bit-lines or bit-line pairs of a memory section (e.g., memory section A). Therefore, the fourth-type interface transfer circuit 308 of the interface transfer circuit 300 may be utilized for simultaneous data sensing and off-bit-line data transition of memory section.

Figure 25:
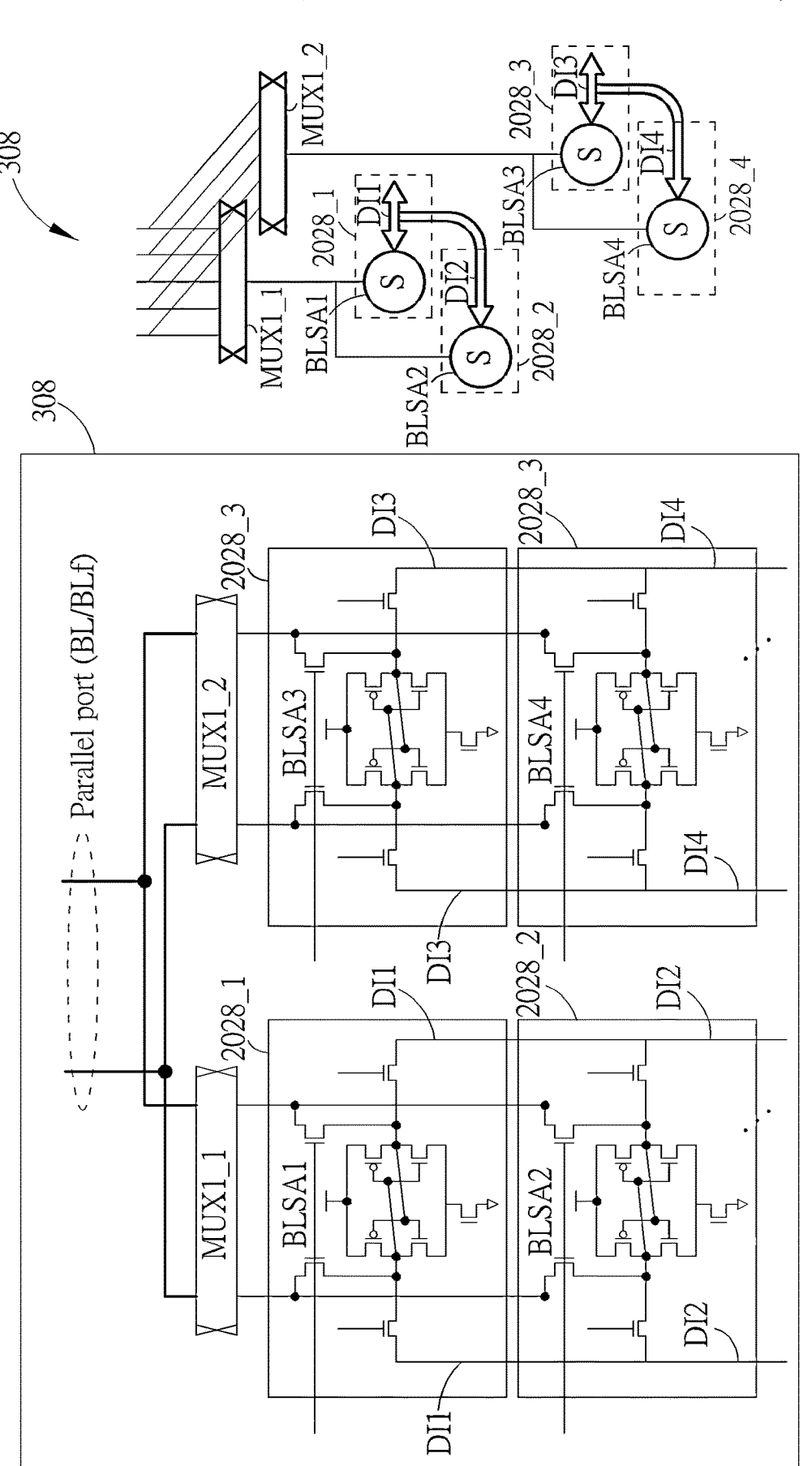
FIG. 25 is a schematic diagram of the fourth-type interface transfer circuit according to an alternative embodiment of the present invention.

In an alternative embodiment, please refer FIG. 25. FIG. 25 is a schematic diagram of the fourth-type interface transfer circuit 308 according to an alternative embodiment of the present invention. An alternative design of the fourth-type interface transfer circuit 308 is applied. FIG. 25 shows an exemplary circuit structure of the fourth-type interface transfer circuit 308. The fourth-type interface transfer circuit 308 of FIG. 25 is modified based on the fourth-type sensing buffer circuit 2028 of FIG. 16 the fourth-type sensing buffer circuits 2028_1 and 2028_2 of FIG. 22. As shown in FIG. 25, the fourth-type interface transfer circuits 308 may include fourth-type sensing buffer circuits 2028_1 to 2028_4 and first multiplexers MUX1_1 and MUX1_2. The units in the first multiplexers MUX1_1 and MUX1_2 with the same designations as those in the first multiplexer MUX1 shown in FIG. 16 have similar operations and functions. The interconnections of the units are as shown in FIG. 25. The units in the fourth-type sensing buffer circuits 2028_1 to 2028_4 with the same designations as those in the fourth-type sensing buffer circuits 2028_1 and 2028_2 shown in FIG. 22 have similar operations and functions. The interconnections of the units are as shown in FIG. 25. The first multiplexers MUX1_1 and MUX1_2 are coupled to the same bit-lines or bit-line pairs of a memory section (e.g., memory section A). The BLSA1 of the fourth-type sensing buffer circuit 2028_1 and the BLSA2 of the fourth-type sensing buffer circuit 2028_2 are coupled to the first multiplexer MUX1_1. The data interface DI1 of the fourth-type sensing buffer circuit 2028_1 is coupled or connected to the data interface DI2 of the fourth-type sensing buffer circuit 2028_2. The BLSA3 of the fourth-type sensing buffer circuit 2028_3 and the BLSA4 of the fourth-type sensing buffer circuit 2028_4 are coupled to the first multiplexer MUX1_2. The data interface DI3 of the fourth-type sensing buffer circuit 2028_3 is coupled or connected to the data interface DI4 of the fourth-type sensing buffer circuit 2028_4.

Figure 26:
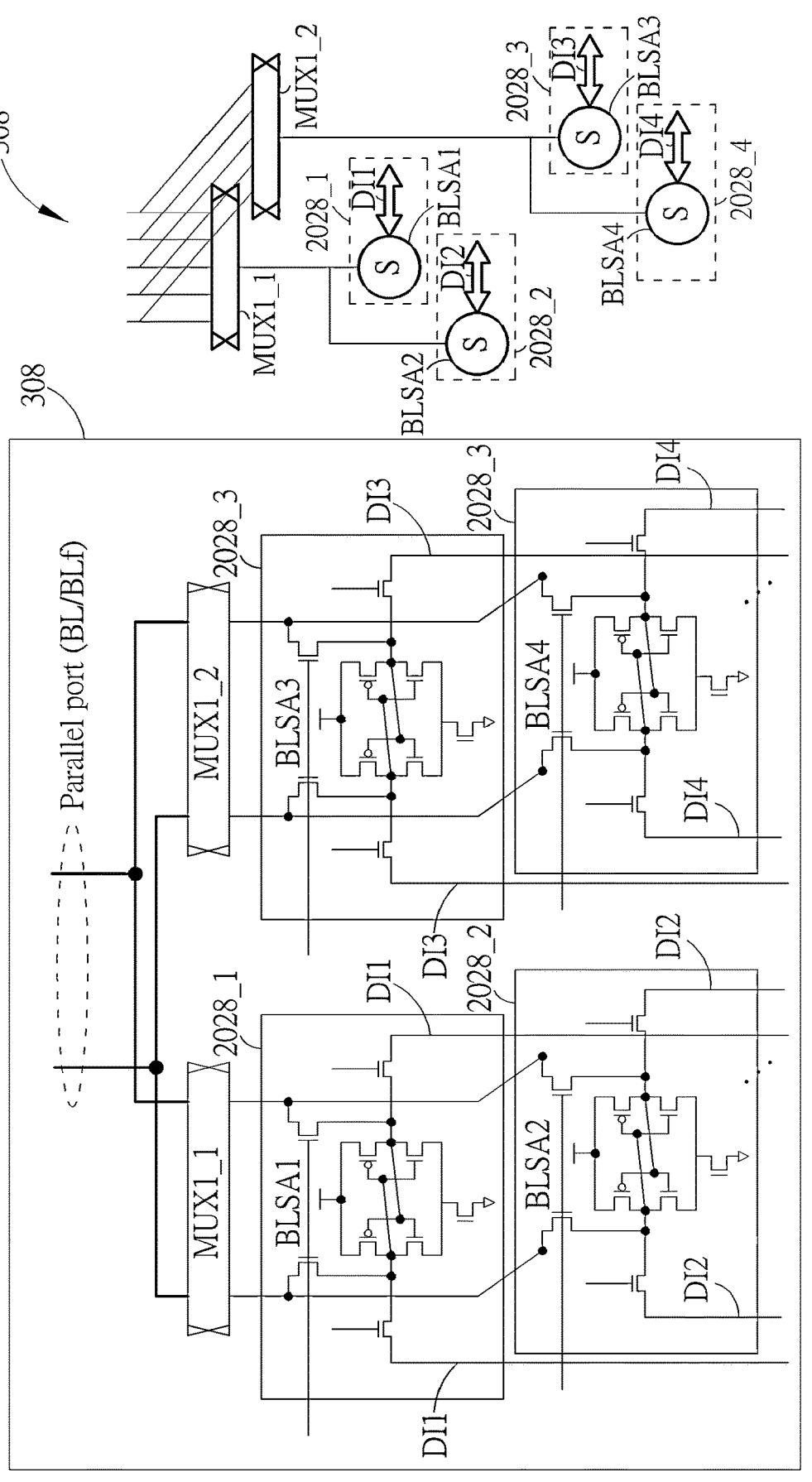
FIG. 26 is a schematic diagram of the fourth-type interface transfer circuit according to an alternative embodiment of the present invention.

In an alternative embodiment, please refer FIG. 26. FIG. 26 is a schematic diagram of the fourth-type interface transfer circuit 308 according to an alternative embodiment of the present invention. Different from the fourth-type interface transfer circuit 308 of FIG. 25, the data interface DI1 of the fourth-type sensing buffer circuit 2028_1 is not coupled to the data interface DI2 of the fourth-type sensing buffer circuit 2028_2. The data interface DI3 of the fourth-type sensing buffer circuit 2028_3 is not coupled to the data interface DI4 of the fourth-type sensing buffer circuit 2028_4.

Figure 27:
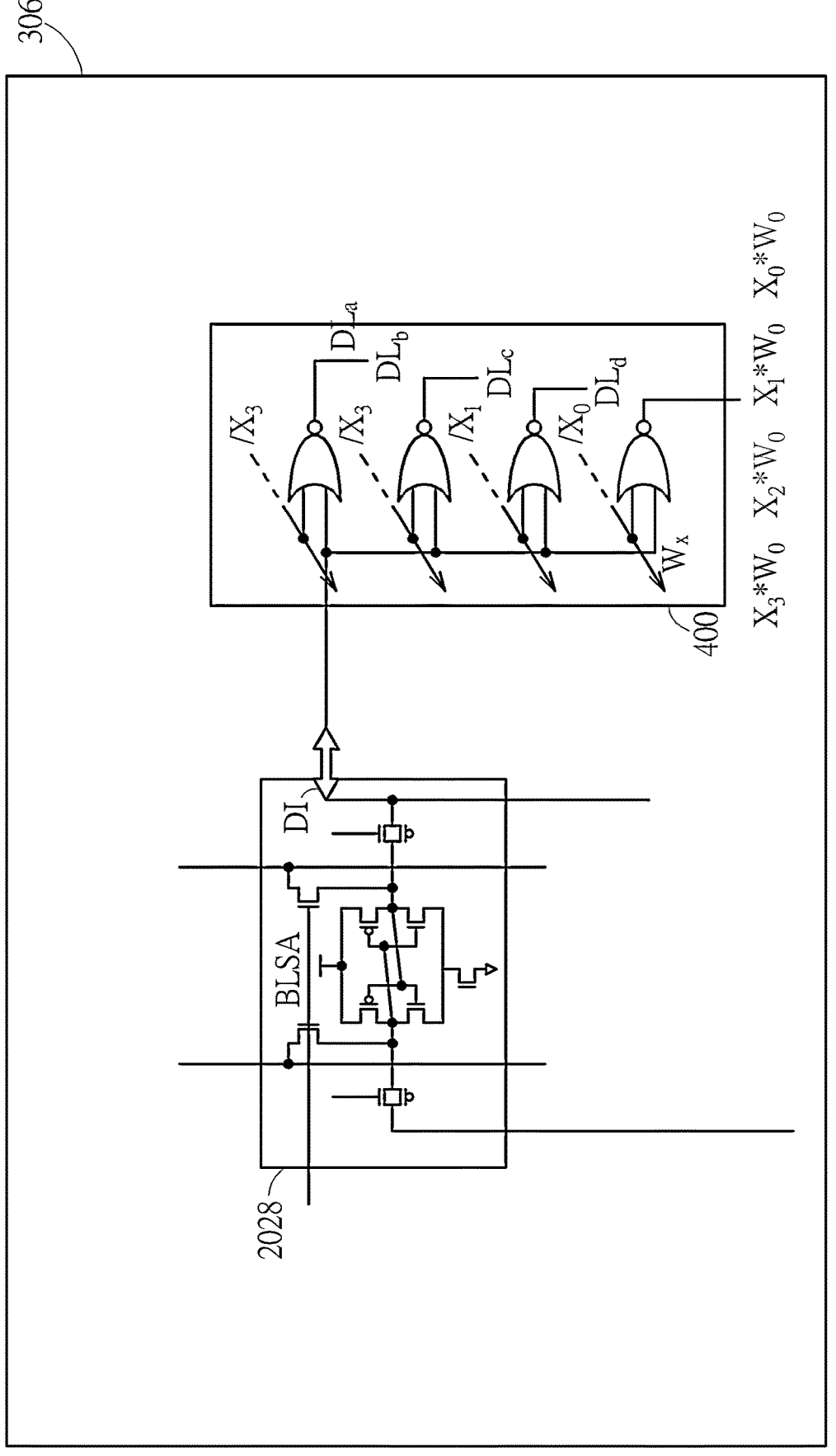
FIG. 27 is a schematic diagram illustrating an exemplary circuit structure of the third-type interface transfer circuit shown in FIG. 18 according to an embodiment of the present invention.

Please refer FIG. 27. FIG. 27 is a schematic diagram illustrating an exemplary circuit structure of the third-type interface transfer circuit 306 shown in FIG. 18 according to an embodiment of the present invention. The computing logic circuit 400 may be utilized for performing a bit-wise multiplication operation. Data signals on the bit-line or bit-line pair in an edge memory section may be sensed, latched, and buffered by the BLSA of the fourth-type sensing buffer circuit 2028. The latched data signals may be driven and transferred to the computing logic circuit 400 via the data interface DI. The computing logic circuit 400 is configured to perform the bit-wise multiplication operation on the received data signals according to selection signals X0-X3, respectively, and output the calculation results to the coupled data bit-lines DLa to DLd.

Figure 28:
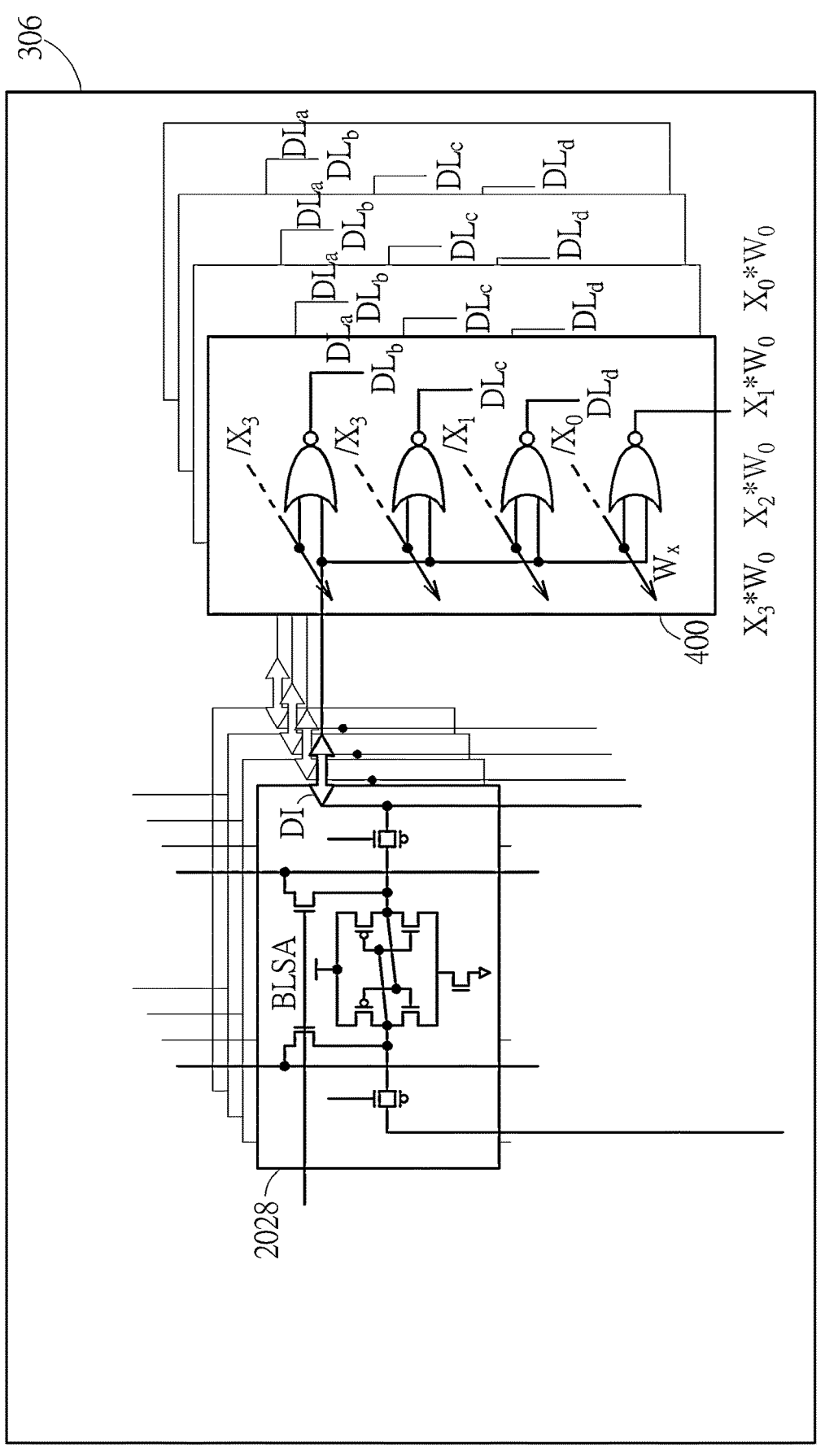
FIG. 28 is a schematic diagram of the third-type interface transfer circuit shown in FIG. 27 according to an alternative embodiment of the present invention.

In an alternative embodiment, FIG. 28 is a schematic diagram of the third-type interface transfer circuit 306 shown in FIG. 27 according to an alternative embodiment of the present invention. Multiple third-type interface transfer circuits 306 are applied for performing shifted-multiplicand bit-wise multiplication operations.

Figure 29:
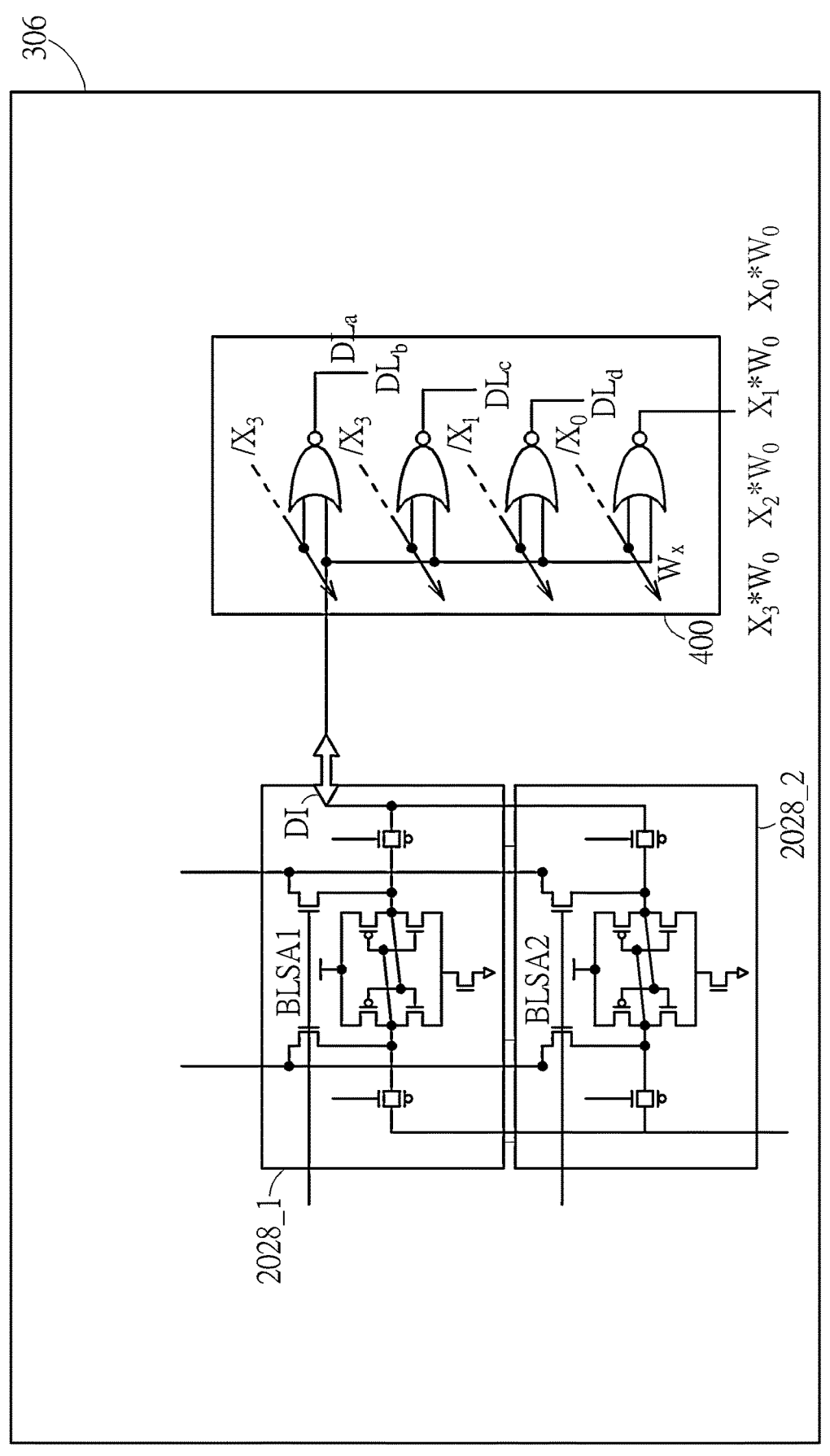
FIG. 29 and FIG. 30 are schematic diagrams illustrating exemplary circuit structures of the third-type interface transfer circuit shown in FIG. 18 according to alternative embodiments of the present invention.
Figure 30:
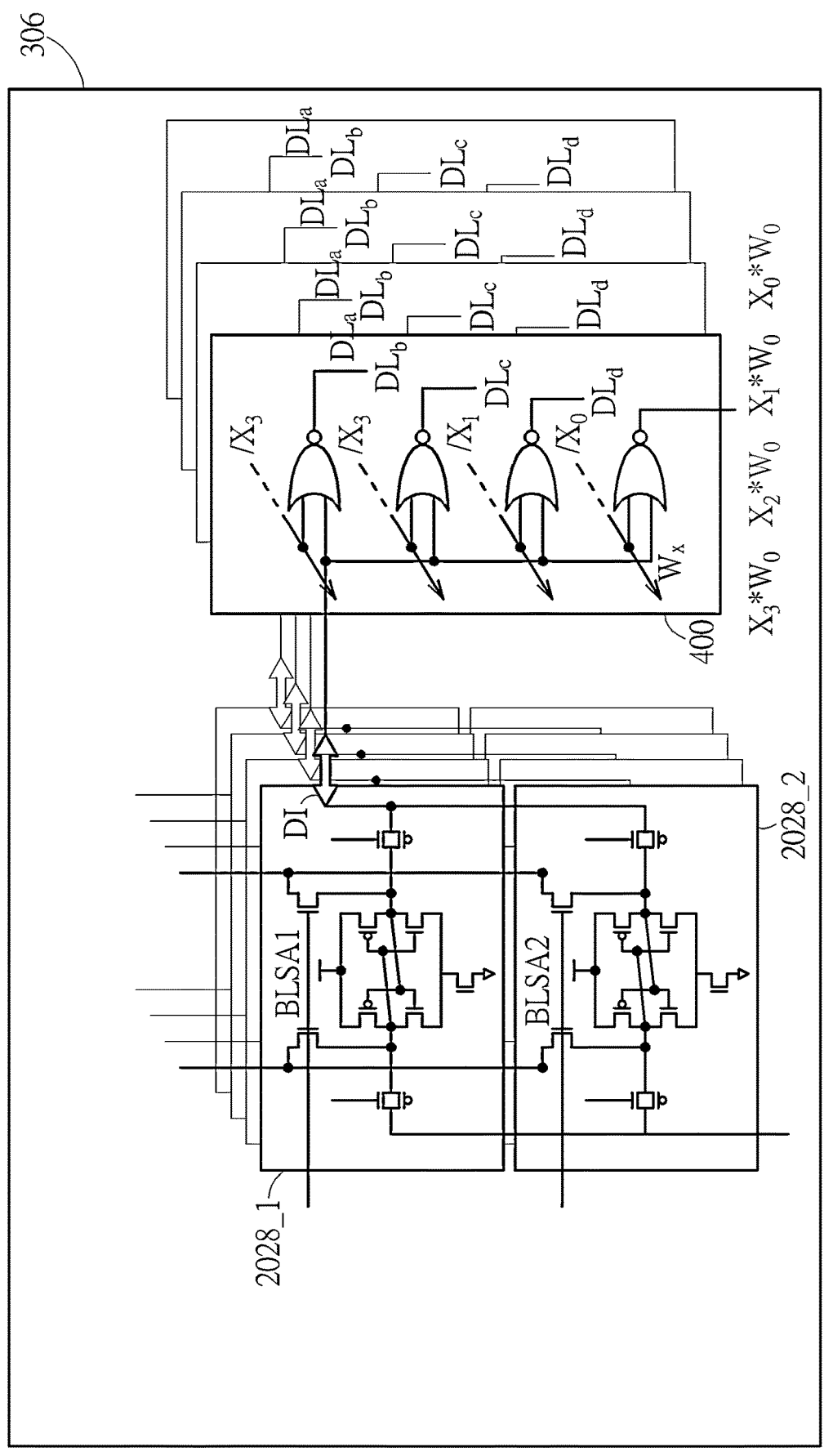

Please refer FIG. 29 and FIG. 30, which are schematic diagrams illustrating exemplary circuit structures of the third-type interface transfer circuit 306 shown in FIG. 18 according to alternative embodiments of the present invention. Therefore, the third-type interface transfer circuit 306 of the interface transfer circuit 300 may be utilized for performing bit-wise multiplication operations seamlessly. The third-type interface transfer circuit 306 includes fourth-type sensing buffer circuits 2028_1 and 2028_2. The fourth-type sensing buffer circuits 2028_1 and 2028_2 may be arranged as a Ping-Pong circuit structure. The BLSA1 of the fourth-type sensing buffer circuit 2028_1 and the BLSA2 of the fourth-type sensing buffer circuit 2028_2 are coupled to the same bit-line or bit-line pair of the memory section, also coupled to the data interface DI. The computing logic circuit 400 may be utilized for performing a bit-wise multiplication operation. During a first operation period, the fourth-type sensing buffer circuit 2028_1 may sense, latch, and buffer data signals from the memory section and the fourth-type sensing buffer circuit 2028_2 may provide the latched data signals to the computing logic circuit 400 via the data interface DI for further athematic operation, such that the computing logic circuit 400 may perform bit-wise multiplication operations on the received data signals according to selection signals X0-X3, respectively, and output the calculation results to the coupled data bit-lines DLa to DLd. During a second operation period, the fourth-type sensing buffer circuit 2028_1 may provide the latched data signals to the computing logic circuit 400 via the data interface DI for further athematic operation, such that the computing logic circuit 400 may perform bit-wise multiplication operations on the received data signals according to selection signals X0-X3, respectively, and output the calculation results to the coupled data bit-lines DLa to DLd. During the second operation period, the fourth-type sensing buffer circuit 2028_2 may sense, latch, and buffer data signals from the memory section. Such like this, during a third operation period, the fourth-type sensing buffer circuit 2028_2 may provide the latched data signals to the computing logic circuit 400 via the data interface DI for further athematic operation, and the fourth-type sensing buffer circuit 2028_1 may sense, latch, and buffer data signals from the memory section. During a fourth operation period, the fourth-type sensing buffer circuit 2028_1 may provide the latched data signals to the computing logic circuit 400 via the data interface DI for further athematic operation, and the fourth-type sensing buffer circuit 2028_2 may sense, latch, and buffer data signals from the memory section. Therefore, the third-type interface transfer circuit 306 with the Ping-Pong circuit structure may be utilized for seamlessly performing bit-wise multiplication operations. Similarly, please re to FIG. 28. FIG. 28 is a schematic diagram of the third-type interface transfer circuit 306 shown in FIG. 29 according to an alternative embodiment of the present invention. Multiple third-type interface transfer circuits 306 with the Ping-Pong circuit structure may be applied for seamlessly performing shifted-multiplicand bit-wise multiplication operations.

In summary, the embodiments of the present invention may provide a memory device and an operation method for data movement within memory sections and external interfaces of the memory device for inter-section data movement and off bit-line transition, without the needs for global or trans-multiple-section data lines, thus reducing circuit area, manufacturing cost and power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
a memory array, divided into a plurality of memory sections, each memory section comprising a plurality of memory cells;
a plurality of data transfer circuits, each data transfer circuit being disposed between two memory sections;
wherein a data movement occurring from all or a selected set of bit-lines or bit-line pairs between any two adjacent memory sections of the memory array is performed, data signals of all or the selected set of bit-lines or bit-line pairs of two adjacent memory sections are sensed, latched, buffered and repeated during the data movement by a data transfer circuit disposed between two adjacent memory sections, and the data movement is sequentially performed between two memory sections to facilitate the transfer of data signals to any memory section of the memory array without the need for global or trans-multiple-section data lines, wherein each data transfer circuit comprises a plurality of third-type data transfer circuits, and each third-type data transfer circuit comprises:
a first first-type sensing buffer circuit, comprising a plurality of first BLSAs, and each first BLSA being coupled to a bit-line or bit-line pair of a memory section;
a first multiplexer, coupled to the plurality of first BLSAs, and configured to select a set of first BLSAs from the plurality of first BLSAs;
a second multiplexer, coupled to the first multiplexer; and
a second first-type sensing buffer circuit, comprising a plurality of second BLSAs, and each second BLSA being coupled to the second multiplexer and a bit-line or bit-line pair of an adjacent memory section;
wherein the first multiplexer is configured to connect the selected set of first BLSAs to the second multiplexer, the second multiplexer is configured to select a set of second BLSAs from the plurality of second BLSAs and connect the selected set of second BLSAs to the first multiplexer;
wherein the data signals on bit-lines or bit-line pairs coupled to the selected set of first BLSAs in the memory section are sensed, latched and buffered by the selected set of first BLSAs, the latched data signals are driven and transferred to the selected set of second BLSAs by the selected set of first BLSAs through connection operations of the first multiplexer and the second multiplexer, the data signals are transferred to bit-lines or bit-line pairs coupled to the selected set of second BLSAs in the adjacent memory section by the selected set of second BLSAs, and the data signals are sequentially transferred across subsequent memory sections through other data transfer circuits which are coupled to two adjacent memory sections.

2. The memory device of claim 1, wherein each data transfer circuit comprises a plurality of first-type data transfer circuits, and each first-type data transfer circuits comprises:
a first-type sensing buffer circuit comprising a bit-line sense amplifier (BLSA), coupled to a bit-line or bit-line pair of a memory section and a bit-line or a bit-line pair of an adjacent memory section;
wherein data signals on the bit-line or bit-line pair in the memory section are sensed, latched, and buffered by the first-type sensing buffer circuit, the latched data signals are driven and transferred to the bit-line or bit-line pair in the adjacent memory section by the first-type sensing buffer circuit, and the data signals are sequentially transferred across subsequent memory sections through other data transfer circuits which are coupled to two adjacent memory sections.

3. The memory device of claim 1, wherein each data transfer circuit comprises a plurality of second-type data transfer circuits, and each second-type data transfer circuit comprises:
a first-type sensing buffer circuit, comprising a BLSA;
a first multiplexer, coupled to a first number of bit-lines or bit-line pairs of a memory section and the first-type sensing buffer circuit, and configured to select a set of bit-lines or bit-line pairs of the memory section from the first number of bit-lines or bit-line pairs of the memory section, and connect the selected set of bit-lines or bit-line pairs of the memory section to the first-type sensing buffer circuit; and
a second multiplexer, coupled to a second number of bit-lines or bit-line pairs of an adjacent memory section and the first-type sensing buffer circuit, and configured to select a set of bit-lines or bit-line pairs of the adjacent memory section from the second number of bit-lines or bit-line pairs of the adjacent memory section, and connect the selected set of bit-lines or bit-line pairs of the adjacent memory section to the first-type sensing buffer circuit;
wherein the data signals on the selected set of bit-lines or bit-line pairs in the memory section are sensed, latched and buffered by the first-type sensing buffer circuit through connection operations of the first multiplexer, the latched data signals are driven and transferred to the selected set of bit-lines or bit-line pairs in the adjacent memory section by the first-type sensing buffer circuit through connection operations of the second multiplexer, and the data signals are sequentially transferred across subsequent memory sections through other data transfer circuits which are coupled to two adjacent memory sections.

4. The memory device of claim 1, wherein each third-type data transfer circuit further comprises:

a data interface, coupled to the first multiplexer;

wherein the first multiplexer is configured to connect the selected set of first BLSAs to the second multiplexer or the data interface;

wherein the data signals on bit-lines or bit-line pairs coupled to the selected set of first BLSAs in the memory section are sensed, latched and buffered by the selected set of first BLSAs, the latched data signals are driven and transferred to the selected set of second BLSAs by the selected set of first BLSAs through connection operations of the first multiplexer and the second multiplexer, and the data signals are driven and transferred to bit-lines or bit-line pairs coupled to the selected set of second BLSAs in the adjacent memory section by the selected set of second BLSAs, or the latched data signals are driven and transferred to the data interface by the selected set of first BLSAs through connection operations of the first multiplexer and the data interface.

5. The memory device of claim 4, wherein each third-type data transfer circuit further comprises:

a computing logic circuit, directly or selectively/multiplexed coupled to the data interface;

wherein the data signals on bit-lines or bit-line pairs coupled to the selected set of first BLSAs are transferred to the data interface by the selected set of first BLSAs, and the data signals are directly or selectively/multiplexed transferred to the computing logic circuit by the data interface.

6. The memory device of claim 1, wherein each data transfer circuit comprises a plurality of fourth-type data transfer circuits, and each fourth-type data transfer circuit comprises:

a second-type sensing buffer circuit, comprising:

a BLSA, coupled to a bit-line or bit-line pair of a memory section and a bit-line or a bit-line pair of an adjacent memory section; and a data interface, other than the bit-line or bit-line pair, coupled to the BLSA;

wherein data signals on the bit-line or bit-line pair in the memory section are sensed, latched, and buffered by the BLSA, the latched data signals are driven and transferred to the bit-line or bit-line pair in the adjacent memory section or the data interface, other than bit-lines or bit-line pairs in memory sections, by the BLSA, and the data signals are sequentially transferred across subsequent memory sections through other data transfer circuits which are coupled to two adjacent memory sections.

7. The memory device of claim 6, wherein each fourth-type data transfer circuit further comprises:

a computing logic circuit, directly or selectively/multiplexed coupled to the data interface;

wherein the data signals are directly or selectively/multiplexed driven and transferred to the computing logic circuit by the data interface.

8. The memory device of claim 1, wherein each data transfer circuit comprises a plurality of fifth-type data transfer circuits, and each fifth-type data transfer circuit comprises:

a second-type sensing buffer circuit, comprising:

a BLSA; coupled to a bit-line or bit-line pair of a memory section; and a data interface, other than bit-lines or bit-line pairs in memory sections, coupled to the BLSA;

a first multiplexer, coupled to a first number of bit-lines or bit-line pairs of a memory section and the first-type sensing buffer circuit, and configured to select a set of bit-lines or bit-line pairs of the memory section from the first number of bit-lines or bit-line pairs of the memory section, and connect the selected set of bit-lines or bit-line pairs of the memory section to the BLSA; and a second multiplexer, coupled to a second number of bit-lines or bit-line pairs of an adjacent memory section and the first-type sensing buffer circuit, and configured to select a set of bit-lines or bit-line pairs of the adjacent memory section from the second number of bit-lines or bit-line pairs of the adjacent memory section, and connect the selected set of bit-lines or bit-line pairs of the adjacent memory section to the BLSA;

wherein the data signals on the selected set of bit-lines or bit-line pairs in the memory section are sensed, latched and buffered by the BLSA through connection operations of the first multiplexer, the latched data signals are driven and transferred to the selected set of bit-lines or bit-line pairs in the adjacent memory section or the data interface by the BLSA, and the data signals are sequentially transferred across subsequent memory sections through other data transfer circuits which are coupled to two adjacent memory sections.

9. The memory device of claim 8, wherein each fifth-type data transfer circuit further comprises:

a computing logic circuit, directly or selectively/multiplexed coupled to the data interface;

wherein the read/write data signals are directly or selectively/multiplexed driven and transferred to the computing logic circuit by the data interface.

10. The memory device of claim 1, further comprising an interface transfer circuit, wherein the interface transfer circuit comprises a plurality of first-type interface transfer circuit, and each first-type interface transfer circuit comprises:

a third-type sensing buffer circuit, comprising a BLSA, and coupled to a bit-line or bit-line pair of a memory section;

wherein data signals on the bit-line or bit-line pair in the memory section are sensed, latched, and buffered by the BLSA.

11. The memory device of claim 1, further comprising an interface transfer circuit, wherein the interface transfer circuit comprises a plurality of second-type interface transfer circuit, and each second-type interface transfer circuit comprises:

a third-type sensing buffer circuit, comprising a BLSA;

a multiplexer, coupled to a first number of bit-lines or bit-line pairs of a memory section and the BLSA, and configured to select a set of bit-lines or bit-line pairs of the memory section from the first number of bit-lines or bit-line pairs of the memory section, and connect the selected set of bit-lines or bit-line pairs of the memory section to the BLSA;

wherein the data signals on the selected set of bit-lines or bit-line pairs in the memory section are sensed, latched, and buffered by the third-type sensing buffer circuit through connection operations of the multiplexer.

12. The memory device of claim 1, further comprising an interface transfer circuit, wherein the interface transfer circuit comprises a plurality of third-type interface transfer circuit, and each third-type interface transfer circuit comprises:

a fourth-type sensing buffer circuit, comprising:
a BLSA, coupled to a bit-line or bit-line pair of one of the pluralities of memory sections; and
a data interface, coupled to the BLSA;
wherein data signals on the bit-line or bit-line pair in the memory section are sensed, latched, and buffered by the BLSA, the latched data signals are driven and transferred to the data interface by the BLSA.

13. The memory device of claim 12, wherein each third-type data transfer circuit further comprises:
a computing logic circuit, directly or selectively/multiplexed coupled to the data interface;
wherein the data signals are directly or selectively/multiplexed driven and transferred to the computing logic circuit by the data interface.

14. The memory device of claim 1, further comprising an interface transfer circuit, wherein the interface transfer circuit comprises a plurality of fourth-type interface transfer circuits, and each fourth-type interface transfer circuit comprises:
a fourth-type sensing buffer circuit, comprising:
a BLSA; and
a data interface, coupled to the BLSA;
a multiplexer, coupled to a first number of bit-lines or bit-line pairs of a memory section and the BLSA, and configured to select a set of bit-lines or bit-line pairs of the memory section from the first number of bit-lines or bit-line pairs of the memory section, and connect the selected set of bit-lines or bit-line pairs of the memory section to the BLSA;
wherein the data signals on the selected set of bit-lines or bit-line pairs in the memory section are sensed, latched, and buffered by the BLSA through connection operations of the multiplexer, the latched data signals are driven and transferred to the data interface by the BLSA.

15. The memory device of claim 14, wherein each fourth-type data transfer circuit further comprises:
a computing logic circuit, directly or selectively/multiplexed coupled to the data interface, wherein the data signals are directly or selectively/multiplexed driven and transferred to the computing logic circuit by the data interface.

16. The memory device of claim 1, further comprising an interface transfer circuit, wherein the interface transfer circuit comprises a plurality of fifth-type interface transfer circuit, and each fifth-type interface transfer circuit comprises:
a plurality of first-type sensing buffer circuits, comprising: a plurality of BLSAs, and each BLSA is coupled to a bit-line or bit-line pair of a memory section;
a multiplexer, coupled to the plurality of BLSAs, and configured to select a set of BLSAs from the plurality of BLSAs; and
a data interface, coupled to the multiplexer;
wherein the multiplexer is configured to connect the selected set of BLSAs to the data interface, and the data signals on bit-lines or bit-line pairs coupled to the selected set of BLSAs in the memory section are sensed, latched, and buffered by the selected set of BLSAs, the latched data signals are driven and transferred to the data interface by the selected set of BLSAs through connection operations of the multiplexer.

17. The memory device of claim 16, wherein each fifth-type data transfer circuit further comprises:
a computing logic circuit, directly or selectively/multiplexed coupled to the data interface, wherein the data signals are directly or selectively/multiplexed driven and transferred to the computing logic circuit by the data interface.

18. An operation method for data movement within memory sections and through external interfaces of a memory device, each memory device comprising a memory array divided into a plurality of memory sections, each memory section comprising a plurality of memory cells, the operation method comprising:
performing a data movement occurring from all or a selected set of bit-lines or bit-line pairs between any two adjacent memory sections of the memory array;
sensing, latching, buffering, and repeating data signals of all or the selected set of bit-lines or bit-line pairs of one of two adjacent memory sections during the data movement to the adjacent memory section by a data transfer circuit disposed between two adjacent memory sections;
sequentially performing the data movement between two memory sections to facilitate the transfer of data signals to the adjacent memory section, and then, to any memory section of the memory array without the need for global or trans-multiple-section data lines; and
retrieving a series of data originally stored in memory cells coupled to a word line, wherein the data, with or without further manipulation, is then stored in the memory cells coupled to a plurality of word lines in a plurality of memory sections sequentially, thereby rotating the series data in the memory device in a transposed manner.

19. The operation method of claim 18, further comprising:
connecting a bit-line or bit-line pair of a memory section to a bit-line or a bit-line pair of an adjacent memory section by a data transfer circuit;
sensing, latching, and buffering the data signals on the bit-line or bit-line pair of the memory section by the data transfer circuit;
transferring the data signals to the bit-line or bit-line pair in the adjacent memory section or a data interface through the data transfer circuit; and
sequentially transferring the data signals across subsequent memory sections through other data transfer circuits which are coupled to two adjacent memory sections.

20. The operation method of claim 18, further comprising:
a word line from a target section or any signal-pass-by section, wherein the word line is activated during the trans-section data movement to capture the data on the bit-lines or bit-line pairs of the section and store it in the memory cells of the section coupled to the activated word line.

21. The operation method of claim 18, further comprising:
selecting a set of bit-lines or bit-line pairs of a memory section from a first number of bit-lines or bit-line pairs of the memory section, and connecting the selected set of bit-lines or bit-line pairs of the memory section to the data transfer circuit;
sensing, latching, and buffering the data signals on the selected set of bit-lines or bit-line pairs of the memory section; and
transferring the data signals to the selected set of bit-lines or bit-line pairs in the adjacent memory section or a data interface, other than the bit-line or bit-line pair, through the data transfer circuit or transferring data signals directly or multiplexed from an external device or other data output ports of this memory device to the data transfer circuit from the data interface, other than the bit-line or bit-line pair.

22. The operation method of claim 18, further comprising:

selecting a set of first BLSAs from a plurality of first BLSAs of a first first-type sensing buffer circuit of the data transfer circuit coupled to bit-lines or bit-line pairs of a memory section, and connecting the selected set of first BLSAs to a second multiplexer by a first multiplexer;

selecting a set of second BLSAs from a plurality of second BLSAs of a second first-type sensing buffer circuit of the data transfer circuit coupled to bit-lines or bit-line pairs of an adjacent memory section, and connecting to the selected set of second BLSAs by the second multiplexer;

sensing, latching, and buffering the data signals on bit-lines or bit-line pairs coupled to the selected set of first BLSAs in the memory section by the selected set of first BLSAs;

transferring the data signals to the selected set of second BLSAs or a data interface by the selected set of first BLSAs through connection operations of the first multiplexer and the second multiplexer;

transferring the data signals to bit-lines or bit-line pairs coupled to the selected set of second BLSAs in the adjacent memory section; and sequentially transferring the data signals across subsequent memory sections through other data transfer circuits which are coupled to two adjacent memory sections.

23. The operation method of claim 18, further comprising:

connecting a bit-line or bit-line pair of a memory section to a data interface or a computing logic circuit by an interface transfer circuit;

sensing, latching, and buffering the data signals on the bit-line or bit-line pair of the memory section by the interface transfer circuit; and transferring data signals directly or multiplexed from an external device or other data output ports of the memory device to the data transfer circuit from the data interface, then to the bit-line or bit-line pair; or transferring the data signals on the bit-line or bit-line pair of the memory section to the data interface or the computing logic circuit by the interface transfer circuit.

24. The operation method of claim 18, further comprising:

selecting a set of bit-lines or bit-line pairs of a memory section from a first number of bit-lines or bit-line pairs of the memory section by a multiplexer of an interface transfer circuit;

connecting the selected set of bit-lines or bit-line pairs of the memory section to a data interface or a computing logic circuit by the multiplexer;

sensing, latching, and buffering the data signals on the selected set of bit-lines or bit-line pairs of the memory section by the interface transfer circuit; and transferring data signals directly or multiplexed from an external device or other data output ports of the memory device to the data transfer circuit from the data interface, then to the selected bit-lines or bit-line pairs; or transferring the data signals on the selected bit-lines or bit-line pairs of the memory section to the data interface or the computing logic circuit through the interface transfer circuit.

25. The operation method of claim 18, further comprising:

selecting a set of BLSAs from a plurality of BLSAs of a first-type sensing buffer circuit of an interface transfer circuit coupled to bit-lines or bit-line pairs of a memory section;

connecting the selected set of BLSAs to a data interface or a computing logic circuit by a multiplexer of the interface transfer circuit;

sensing, latching, and buffering the data signals on bit-lines or bit-line pairs coupled to the selected set of BLSAs in the memory section by the selected set of BLSAs of first-type sensing buffer circuit; and transferring data signals directly or multiplexed from an external device or other data output ports of the memory device to the data transfer circuit from the data interface, then to the selected bit-lines or bit-line pairs; or transferring the data signals to the data interface or the computing logic circuit by the selected set of BLSAs through connection operations of the multiplexer.

26. The operation method of claim 18, further comprising:

connecting a bit-line or bit-line pair of a memory section to a first sensing buffer circuit of an interface transfer circuit during a first operation period;

sensing, latching, and buffering the data signals on the bit-line or bit-line pair of the memory section by the first sensing buffer circuit during the first operation period;

transferring the data signals latched by the first sensing buffer circuit to a computing logic circuit by the first sensing buffer circuit during a second operation period after the first operation period;

connecting the bit-line or bit-line pair of the memory section to the logic circuit by a second sensing buffer circuit of the interface transfer circuit during the second operation period;

sensing, latching, and buffering the data signals on the bit-line or bit-line pair of the memory section by the second sensing buffer circuit during the second operation period; and transferring the data signals latched by the second sensing buffer circuit to the computing logic circuit by the second sensing buffer circuit during a third operation period that can also simultaneously sense bit-line or bit-line pair signals with the first sensing buffer circuit.

27. The operation method of claim 18, further comprising:

copying and moving a page of data from the memory sections in advance to the memory sections that are adjacent to or near computing logic circuits for fast or repeated access and manipulation the page data.

28. The operation method of claim 18, wherein all or part of variant types of data transfer circuits, coupled to the bit-line or bit-line pairs in the memory section, interface transfer circuits, and data interfaces among the multiple-section memory array, are configured to be operated in serial or parallel.

\* \* \* \* \*